US006905582B2

(12) United States Patent
Kidd et al.

(10) Patent No.: US 6,905,582 B2
(45) Date of Patent: Jun. 14, 2005

(54) CONFIGURABLE VACUUM SYSTEM AND METHOD

(75) Inventors: Jerry D. Kidd, Granbury, TX (US); Craig D. Harrington, Cleburne, TX (US); Daniel N. Hopkins, Fort Worth, TX (US)

(73) Assignee: Basic Resources, Inc., Dallas, TX (US)

( * ) Notice: Subject to any disclaimer, the term of this patent is extended or adjusted under 35 U.S.C. 154(b) by 91 days.

(21) Appl. No.: 10/369,446

(22) Filed: Feb. 17, 2003

(65) Prior Publication Data

US 2003/0159926 A1 Aug. 28, 2003

Related U.S. Application Data

(63) Continuation of application No. 09/578,166, filed on May 22, 2000, now Pat. No. 6,521,104.

(51) Int. Cl.[7] ........................... C23C 16/00; C23C 14/34
(52) U.S. Cl. ........................... 204/298.05; 204/298.15; 204/298.25; 204/298.23; 204/298.27; 204/298.28; 118/719; 118/723 R; 118/723 VE; 118/723 EB; 118/723 MP; 118/723 E; 118/727; 118/730
(58) Field of Search ........................ 204/298.05, 298.15, 204/298.23, 298.25, 298.28, 298.27; 118/719, 723 R, 723 VE, 723 EB, 723 MP, 723 E, 729, 730

(56) References Cited

U.S. PATENT DOCUMENTS

| | | | |
|---|---|---|---|
| 3,329,601 A | 7/1967 | Mattox | 204/298 |
| 3,719,052 A | 3/1973 | White | 62/3 |
| 3,756,847 A | 9/1973 | Leibowitz et al. | 117/93.3 |
| 3,857,682 A | 12/1974 | White | 29/195 |
| 3,961,103 A | 6/1976 | Aisenberg | 427/39 |
| 4,016,389 A | 4/1977 | White | 219/10.49 |
| 4,039,416 A | 8/1977 | White | 204/192 N |
| 4,054,426 A | 10/1977 | White | 51/309 R |
| 4,082,636 A | 4/1978 | Takagi | 204/192 N |
| 4,126,521 A | 11/1978 | Coffin | 204/15 |

(Continued)

FOREIGN PATENT DOCUMENTS

| | | | | |
|---|---|---|---|---|
| DE | 2118 082 | 10/1972 | | 37/30 |
| DE | 44 18 161 A1 | 11/1995 | | 37/30 |

(Continued)

OTHER PUBLICATIONS

U.S. Appl. No. 09/472,775, filed Oct. 26, 1999 entitled *System and Method for Plasma Plating*, by Applicants: Jerry D. Kidd, Craig D. Harrington, Daniel N. Hopkins.

(Continued)

*Primary Examiner*—Rodney G. McDonald
(74) *Attorney, Agent, or Firm*—Hunton & Williams LLP

(57) ABSTRACT

An exemplary configurable vacuum system is provided for use in coating or plating that provides the capability and versatility to handle substrates of significantly different shapes and sizes. The configurable vacuum system includes a vacuum table assembly, a mechanical drive, an electrical feed through, a filament, and a vacuum chamber. The vacuum table assembly may include a support frame, a sliding means, such as a roller or rollers, an insulated surface, and a platform operable to rotate and support the substrate. The mechanical drive is operable to rotate the platform, the electrical feed through provides an electrical signal to the substrate, and the filament is positioned relative the substrate. The vacuum chamber includes a main opening, an internal volume, and a receiving means, such as a railing or member, operable to receive and support the vacuum table assembly within the internal volume of the vacuum chamber and through the sliding means of the vacuum table assembly.

30 Claims, 13 Drawing Sheets

U.S. PATENT DOCUMENTS

| | | | |
|---|---|---|---|
| 4,137,370 A | 1/1979 | Fujishiro et al. | 428/660 |
| 4,213,844 A | 7/1980 | Morimoto et al. | 204/298 |
| RE30,401 E | 9/1980 | White | 204/192 N |
| 4,282,597 A | 8/1981 | Yenawine et al. | 368/280 |
| 4,293,171 A | 10/1981 | Kakumoto et al. | 308/188 |
| 4,310,614 A | 1/1982 | Connell et al. | 430/271 |
| 4,342,631 A | 8/1982 | White et al. | 204/192 N |
| 4,407,712 A | 10/1983 | Henshaw et al. | 204/298 |
| 4,420,386 A | 12/1983 | White | 204/192 N |
| 4,461,689 A | 7/1984 | Diepers | 204/192 N |
| 4,468,309 A | 8/1984 | White | 204/192 N |
| 4,480,010 A | 10/1984 | Sasanuma et al. | 428/457 |
| 4,530,885 A | 7/1985 | Restall | 428/670 |
| 4,603,057 A | 7/1986 | Ueno et al. | 427/40 |
| 4,667,620 A | 5/1987 | White | 118/50.1 |
| 4,673,586 A | 6/1987 | White | 427/38 |
| 4,725,345 A | 2/1988 | Sakamoto et al. | 204/192.31 |
| 4,826,365 A | 5/1989 | White | 408/144 |
| 4,852,516 A | 8/1989 | Rubin et al. | 118/715 |
| 4,863,581 A | 9/1989 | Inokuti et al. | 204/298 |
| 4,885,069 A | 12/1989 | Coad et al. | 204/192.31 |
| 4,938,859 A | 7/1990 | Ide et al. | 118/723 |
| 4,956,858 A | 9/1990 | Upadhya | 378/133 |
| 4,990,233 A | 2/1991 | Hahn | 204/192.31 |
| 5,061,512 A | 10/1991 | Upadhya | 427/38 |
| 5,076,205 A | 12/1991 | Vowles et al. | 118/719 |
| 5,078,847 A | 1/1992 | Grosman et al. | 204/192.31 |
| 5,085,499 A | 2/1992 | Griffin et al. | 356/311 |
| 5,208,079 A | 5/1993 | Fukushima et al. | 427/527 |
| 5,227,203 A | 7/1993 | Kibe et al. | 427/527 |
| 5,252,365 A | 10/1993 | White | 427/525 |
| 5,380,420 A | 1/1995 | Tsuji | 204/298.41 |
| 5,403,419 A | 4/1995 | Yoshikawa et al. | 156/151 |
| 5,409,762 A | 4/1995 | Ozaki et al. | 428/216 |
| 5,514,260 A | 5/1996 | Seo | 204/298.26 |
| 5,556,519 A | 9/1996 | Teer | 204/192.12 |
| 5,595,814 A | 1/1997 | Yamagata et al. | 428/216 |
| 5,730,847 A | 3/1998 | Hanaguri et al. | 204/298.41 |
| 5,744,811 A | 4/1998 | Schonberg et al. | 250/492.3 |
| 5,798,496 A | 8/1998 | Eckhoff et al. | 219/121.36 |
| 5,889,587 A | 3/1999 | D'Silva et al. | 356/316 |
| 6,090,157 A | 7/2000 | Traut et al. | 8/149.3 |
| 6,153,270 A | 11/2000 | Russmann et al. | 427/522 |
| 6,156,392 A | 12/2000 | Duffy et al. | 427/475 |
| 6,521,104 B1 * | 2/2003 | Kidd et al. | 204/298.05 |

FOREIGN PATENT DOCUMENTS

| | | | |
|---|---|---|---|
| EP | 0 374 060 A1 | 6/1990 | |
| EP | 0 492 511 A2 | 7/1992 | 37/16 |
| EP | 0 653 252 A1 | 5/1995 | 1/6 |
| WO | WO 01/90436 A2 | 11/2001 | |
| WO | WO 01/90437 A2 | 11/2001 | |

OTHER PUBLICATIONS

U.S. Appl. No. 10/103,725, filed Mar. 22, 2002 entitled *System and Method for Preventing Breaker Failure*, by Applicants: Jerry D. Kidd, Craig D. Harrington, Daniel N. Hopkins.

U.S. Appl. No. 09/576,640, filed May 22, 2000 entitled *Mobile Plating System and Method*, by Applicants: Jerry D. Kidd, Craig D. Harrington, Daniel N. Hopkins.

U.S. Appl. No. 09/578,166, filed May 22, 2000 entitled *Configurable Vacuum System and Method*, by Applicants: Jerry D. Kidd, Craig D. Harrington, Daniel N. Hopkins.

U.S. Appl. No. not assigned, filed Jan. 6, 2003 entitled *Mobile Plating System and Method*, by Applicants: Jerry D. Kidd, Craig D. Harrington, Daniel N. Hopkins.

Bunshah, R. F., *Microstructure and Properties*, article from *Handbook of Deposition Technologies for Films and Coatings*, 1994, 7 pgs., Second Edition, Noyes Publications, Westwood, New Jersey U.S.A.

Bartlett, Edwin S. et al., *Oxidation Protective Coatings for Superalloys and Refractory Metals*, article from *Metals Handbook, Ninth Edition, vol. 5 Surface Cleaning, Finishing, and Coating*, 1982, 57 pgs., American Society for Metals. Metals Park, Ohio.

Harper, James M.E. et al., *Modification of Thin Film Properties by Ion Bombardment During Deposition*, Chapter 4 from *Ion Bombardment Modification of Surfaces*, 1984, 4 pgs., Elsevier Science Publishers B.V., Amsterdam, The Netherlands.

Hopkins, Daniel N. et al., *Magion: Reduce Galling, Control Friction, Save Money*, 1997, 10 pgs., TU Electric, Glen Rose, Texas.

Hopkins, Daniel N. et al., *Use of Engineered Surfaces to Reduce Galling, Control Friction, and Save Money*, 1998, 11 pgs., TU Electric, Glen Rose, Texas.

Hopkins, Daniel N. et al., *Magion: Engineered Surfaces to Control Galling and Reduce Maintenance Costs*, 1998, 5 pgs., TU Electric, Glen Rose, Texas.

Hopkins, Daniel N. et al., *Reduce Maintenance Costs by Using Engineered Surfaces to Control Friction and Galling*, 1999, Reprinted from WEAR, 14 pgs., TU Electric, Glen Rose, Texas.

Kazan, Joe, et al., *Maglon*, article from *Energy Diegest*, 1997, 4 pgs., Westinghouse Electric Company, Pittsburgh, Pennsylvania.

*Metal Seals*, article from *Nuclear News*, 1997, 2 pgs., American Nuclear Society, LaGrange Park, Illinois.

Kidd, Jerry, *Maglon: The Metallurgical Anti–Seize Lubricant*, 1998, 13 pgs., TU Electric, Glen Rose, Texas.

Black, Bill R. et al., *Engineered Surface Reduce Maintenance Costs*, 1998, 6 pgs., TU Electric, Glen Rose, Texas.

Black, Bill R. et al., *Vacuum Coating Mitigates Galling, Controls Friction*, 1999, 3 pgs., Power Magazine.

Pamphlet, *Maglon, Mitigate Galling, Control Friction, Reduce Cost with . . .*, 1998, 3 pgs., Westinghouse Electric Company, Madlaon, Pennsylvania.

Dulaney, R.R. et al., *Maglon Recommendations (Technical)*, 1999, 2 pgs., Westinghouse Electric Company.

*Instructions for Low–Voltage Power Circuit Breakers Types DS and DSL*, 1979, 94 pgs., Westinghouse Electric Company, East Pittsburgh, Pennsylvania.

Aronson, A. J. et al., *Preparation of Titanium Nitride by a Pulsed D.C. Magnetron Reactive Deposition Technique Using the Moving Mode of Deposition*, 1980, 6 pgs., Materials Research Corporation, Orangeburg, New York.

Mattox, D. M., *Fundamentals of Ion Plating*, 1973, 6 pgs., Sandia Laboratories, Albuquerque, New Mexico.

Geis, Charles G. et al., *Maintenance Program Manual MPM–DS Breaker For Westinghouse Type DS Circuit Breakers and Associated Switchgear*, 1993, 150 pgs., Westinghouse Electric Company, Pittsburg, Pennsylvania.

Pending U.S. patent application 08/573,870; inventor: White (et al?)—Applicants do not have a copy.

* cited by examiner

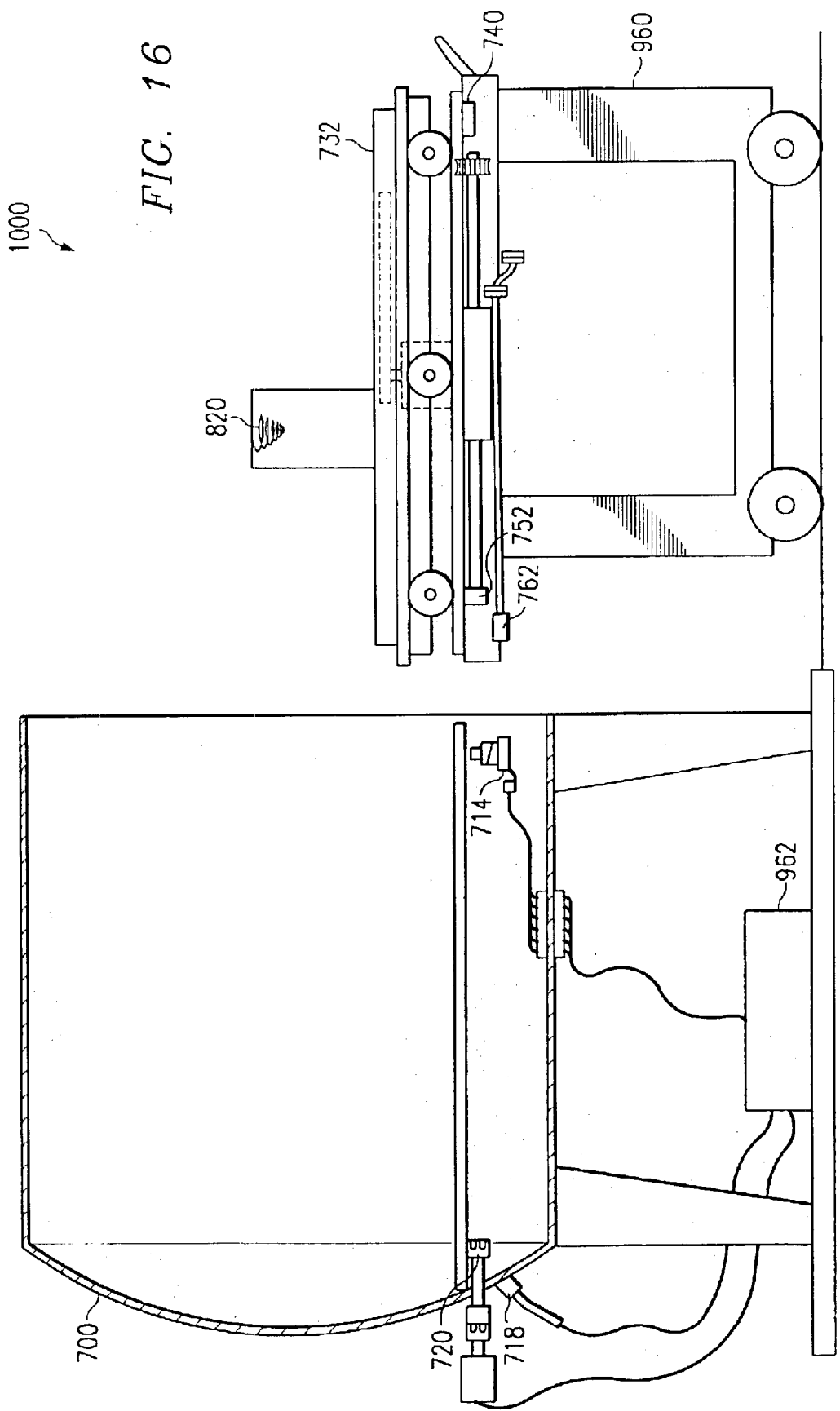

CONFIGURABLE VACUUM SYSTEM AND METHOD

RELATED APPLICATIONS

Pursuant to 35 U.S.C. §120, this continuation application claims priority from, and hereby incorporates by reference for all purposes, U.S. patent application Ser. No. 09/578, 166, entitled Configurable Vacuum System and Method, naming Jerry D. Kidd, Craig D. Harrington, and Daniel N. Hopkins as joint inventors, filed May 22, 2000, and now U.S. Pat. No. 6,521,104. This application does not claim priority from but is related to U.S. patent application Ser. No. 09/427,775, entitled System and Method for Plasma Plating, naming Jerry D. Kidd, Craig D. Harrington, and Daniel N. Hopkins as joint inventors, filed Oct. 26, 1999; U.S. patent application Ser. No. 09/576,640, entitled Mobile Plating System and Method, naming Jerry D. Kidd, Craig D. Harrington, and Daniel N. Hopkins as joint inventors, filed May 22, 2000, and now U.S. Pat. No. 6,503,379; U.S. Continuation patent application Ser. No. 10/337,534, entitled Mobile Plating System and Method, naming Jerry D. Kidd, Craig D. Harrington, and Daniel N. Hopkins as joint inventors, filed Jan. 6, 2003; and U.S. Divisional patent application Ser. No. 10/337,642, entitled Mobile Plating System and Method, naming Jerry D. Kidd, Craig D. Harrington, and Daniel N. Hopkins as joint inventors, filed Jan. 6, 2003.

TECHNICAL FIELD OF THE INVENTION

This invention relates in general to the field of vacuum systems and deposition technology for plating and coating materials and more particularly to a configurable vacuum system and method.

BACKGROUND OF THE INVENTION

Deposition technologies for coating and plating materials and developing engineered surfaces may include any of a variety of deposition technologies. These deposition technologies may include, for example, vacuum deposition, physical vapor deposition ("PVD"), chemical vapor deposition ("CVD"), sputtering, and ion plating.

Generally, all of these deposition technologies require a vacuum system with a platform for proper support and positioning of the substrate within a vacuum chamber to ensure that a desired plating is achieved. The platform may also be referred to as a table, turntable, base plate, and the like. The proper support, presentation, and positioning of the substrate on or by the platform during plating is critical to achieve a desired, repeatable, and successful plating. Often, the platform must provide rotational motion to the substrate during plating to achieve a more uniform or desired coating or plating.

Unfortunately, substrates come in all shapes and sizes and often, a platform that is used in a vacuum chamber to support or rotate a substrate during plating works well with one particular shape or type of substrate, but poorly for another. Further, many vacuum chambers only support one type of platform or table, and few, if any platforms contemplate substrates of significantly different shapes and sizes. This significantly limits the effective use of expensive deposition and plating systems, including expensive vacuum chambers and platforms.

SUMMARY OF THE INVENTION

From the foregoing it may be appreciated that a need has arisen for a configurable vacuum system and method for use in coating or plating that provides the capability to handle substrates of significantly different shapes and sizes. In accordance with the present invention, a configurable vacuum system and method are provided that substantially eliminate one or more of the disadvantages and problems outlined above.

According to an aspect of the present invention, a configurable vacuum system is provided that includes a vacuum table assembly, a mechanical drive, an electrical feed through, a filament, and a vacuum chamber. The vacuum table assembly may include a support frame, a sliding means, such as a roller or rollers, an insulated surface, and a platform operable to rotate and support the substrate. The mechanical drive is operable to rotate the platform, the electrical feed through provides an electrical signal to the substrate, and the filament is positioned relative the substrate. The vacuum chamber includes a main opening, an internal volume, and a receiving means, such as a railing or member, operable to receive and support the vacuum table assembly within the internal volume of the vacuum chamber and through the sliding means of the vacuum table assembly.

The present invention provides a profusion of technical advantages that include the capability to use a vacuum system for plating, such as plasma plating, substrates of significantly different shapes, sizes, and dimensions. This greatly increases the value of such a vacuum system by providing the versatility to use the same system to coat many different types of substrates.

Another technical advantage of the present invention includes the capability to provide substrate rotation in different planes, such as rotation on a horizontal plane and on a vertical plane. This increases the versatility and usefulness of the vacuum system and vacuum table assembly.

Another technical advantage of the present invention includes the capability to efficiently plate or "shoot" first array of parts using the vacuum system of the present invention, and then to quickly and expeditiously transition to plate or "shoot" a second array of parts, whether the parts are similar or different, or require different platforms for plating.

Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which:

FIG. 16 is a side view of the configurable vacuum system with the vacuum table assembly being loaded into the vacuum chamber using a cart.

DETAILED DESCRIPTION OF THE INVENTION

It should be understood at the outset that although an exemplary implementation of the present invention is illustrated below, the present invention may be implemented using any number of techniques, whether currently known or in existence. The present invention should in no way be limited to the exemplary implementations, drawings, and techniques illustrated below, including the exemplary design and implementation illustrated and described herein.

Initially, a system and method for plasma plating is described in detail below in connection with FIGS. 1–6 to illustrate a type of deposition technology that may be used with the configurable vacuum system and method of the present invention. Finally, an embodiment of the configurable vacuum system and method are described in detail in connection with FIGS. 7–16 that implement, as an example, the plasma plating system type of deposition technology detailed previously in connection with FIGS. 1–6. It should be understood, however, that the configurable vacuum system and method of the present invention are not limited to such deposition technology.

Figure 1:
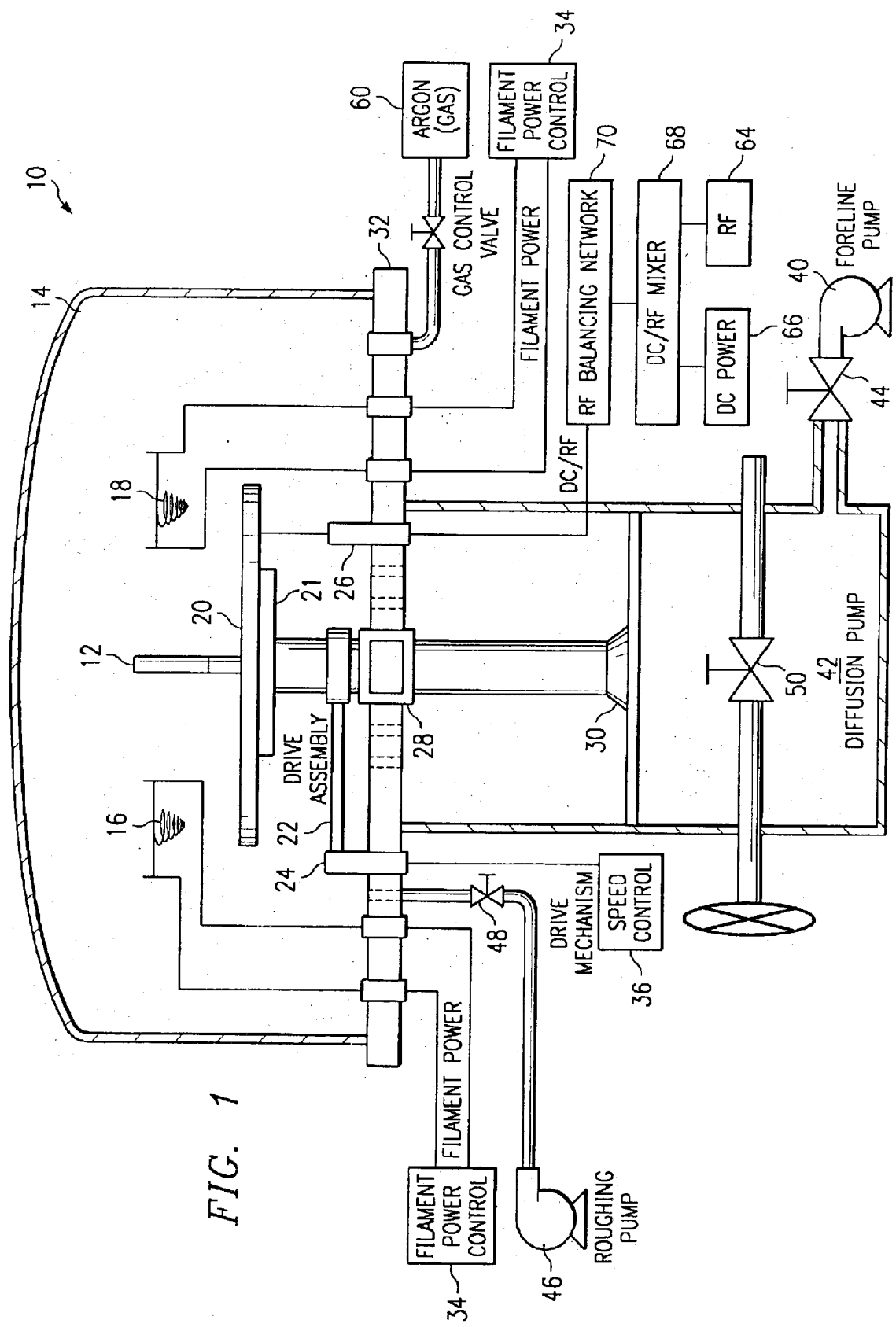
FIG. 1 is a schematic diagram that illustrates a system for plasma plating that can be used to plate materials, according to an embodiment of the present invention.

FIG. 1 is a schematic diagram that illustrates a system 10 for plasma plating that can be used to plate any of a variety of materials, according to an embodiment of the present invention. The system 10 includes various equipment used to support the plasma plating of a substrate 12 within a vacuum chamber 14. Once appropriate operating parameters and conditions are achieved, a depositant provided in a filament 16 and a filament 18 may be evaporated or vaporized to form a plasma. The plasma will contain, generally, positively charged ions from the depositant and will be attracted to the substrate 12 where they will form a deposition layer. The plasma may be thought of as a cloud of ions that surround or are located near the substrate 12. The plasma will generally develop a dark region, near the closest surface of the substrate 12 from the filament 16 and the filament 18, that provides acceleration of the positive ions to the substrate 12.

The filament 16 and the filament 18 reside within the vacuum chamber 14 along with a platform 20, which supports the substrate 12. A drive assembly 22 is shown coupled between a drive motor 24 and a main shaft of the platform 20 within the vacuum chamber 14. In the embodiment shown in FIG. 1, the platform 20 is provided as a turntable that rotates within the vacuum chamber 14. The drive assembly 22 mechanically links the rotational motion of the drive motor 24 with the main shaft of the platform 20 to impart rotation to the platform 20. The rotation of the main shaft of the platform 20 is enhanced through various support bearings such as a base plate bearing 28 and a platform bearing 30.

As is illustrated, the vacuum chamber 14 resides or is sealed on a base plate 32. The vacuum chamber 14 may be provided using virtually any material that provides the appropriate mechanical characteristics to withstand an internal vacuum and an external pressure, such as atmospheric pressure. For example, the vacuum chamber 14 may be provided as a metal chamber or as a glass bell. In an alternative embodiment, the base plate 32 serves as the platform 20 to support the substrate 12. The base plate 32 may be thought of as part of the vacuum chamber 14.

The base plate 32 also provides mechanical support for the system 10 while allowing various devices to feed through from its bottom surface to its top surface within the vacuum chamber 14. For example, the filament 16 and the filament 18 receive power from a filament power control module 34. It should be noted that although two filament power control modules 34 are shown in FIG. 1, preferably, these two modules are implemented as one module. In order to provide power to the filament 16 and the filament 18, electrical leads must feed through the base plate 32 as illustrated in FIG. 1. Similarly, the drive motor 24 must also penetrate or feed through the base plate 32 to provide mechanical action to the drive assembly 22 so that the platform 20 may be rotated. The electrical feed through 26, described more fully below, also feeds through the base plate 32 and provides an electrical conductive path between the platform 20 and various signal generators, also described more fully below. In a preferred embodiment, the electrical feed through 26 is provided as a commutator that contacts the bottom surface of the platform 20, in the embodiment where the platform 20 is implemented as a turntable. The electrical feed through 26 may be implemented as a commutator and may be implemented as a metal brush which can contact the bottom surface of the platform 20 and maintain an electrical contact even if the platform 20 rotates.

The filament power control module 34 provides an electric current to the filament 16 and the filament 18. In one embodiment, the filament power control module 34 can provide current to the filament 16 for a particular duration, and then provide current to the filament 18 during a second duration. Depending upon how the filaments are configured, the filament power control module 34 may provide current to both the filament 16 and the filament 18 at the same time or during separate intervals. This flexibility allows more than one particular depositant material to be plasma plated onto the substrate 12 at different times. The filament power control module 34 preferably provides alternating current to the filaments, but may provide a current using any known method of generating current. In a preferred embodiment, the filament power control module 34 provides current at an amplitude or magnitude that is sufficient to generate enough heat in the filament 16 to evaporate or vaporize the depositant provided therein.

In order to ensure even heating of the depositant, which will be provided at or in the filament 16 or the filament 18, the current provided by the filament control module 34 will preferably be provided using incremental staging so that a more even heat distribution will occur in the depositant that is being melted within the vacuum chamber 14.

In a preferred embodiment, the platform 20 is implemented as a turntable and rotates using the mechanical linkage as described above. A speed control module 36, as shown in FIG. 1, may be provided to control the speed of the rotation of the platform 20. Preferably, the rotation of the platform 20 occurs at a rate from five revolutions per minutes to 30 revolutions per minute. It is believed that an optimal rotational rate of the platform 20 for plasma plating is provided at a rotational rate of 12 revolutions per minute to 15 revolutions per minute. The advantages of rotating the platform 20 are that the substrate 12 can be more evenly plated or coated. This is especially true when multiple substrates are provided on the surface of the platform 20. This allows each one of the multiple substrates to be similarly positioned, on average, within the vacuum chamber 14 during the plasma plating process.

In other embodiments, the platform 20 may be provided at virtually any desired angle or inclination. For example, the platform 20 may be provided as a flat surface, a horizontal surface, a vertical surface, an inclined surface, a curved surface, a curvilinear surface, a helical surface, or as part of the vacuum chamber such as a support structure provided within the vacuum chamber. As mentioned previously, the platform 20 may be stationary or rotate. In an alternative embodiment, the platform 20 includes rollers that may be used to rotate one or more substrates.

The platform 20, in a preferred embodiment, provides or includes an electrically conductive path to provide a path between the electrical feed through 26 and the substrate 12. In one embodiment, platform 20 is provided as a metal or electrically conductive material such that an electrically conductive path is provided at any location on the platform 20 between the electrical feed through 26 and the substrate 12. In such as a case, an insulator 21, will be positioned between the platform 20 and the shaft that rotates the platform 20 to provide electrical isolation. In another embodiment, the platform 20 includes electrically conductive material at certain locations on its top surface that electrically coupled to certain locations on the bottom surface. In this manner, the substrate 12 can be placed at an appropriate location on the top side of the platform 20 while the electrical feed through 26 may be positioned or placed at an appropriate location on the bottom side of the platform 20. In this manner, the substrate 12 is electrically coupled to the electrical feed through 26.

The electrical feed through 26 provides a dc signal and a radio frequency signal to the platform 20 and the substrate 12. The desired operational parameters associated with each of these signals are described more fully below. Preferably, the dc signal is generated by a dc power supply 66 at a negative voltage and the radio frequency signal is generated by an rf transmitter 64 at a desired power level. The two signals are then preferably mixed at a dc/rf mixer 68 and provided to the electrical feed through 26 through an rf balancing network 70, which provides signal balancing by minimizing the standing wave reflected power. The rf balancing network 70 is preferably controlled through a manual control.

In an alternative embodiment, the platform 20 is eliminated, including all of the supporting hardware, structures, and equipment, such as, for example, the drive motor 24, and the drive assembly 22. In such a case the substrate 12 is electrically coupled to the electrical feed through 26.

The remaining equipment and components of the system 10 of FIG. 1 are used to create, maintain, and control the desired vacuum condition within the vacuum chamber 14. This is achieved through the use of a vacuum system. The vacuum system includes a roughing pump 46 and a roughing valve 48 that is used to initially pull down the pressure in the vacuum chamber 14. The vacuum system also includes a foreline pump 40, a foreline valve 44, a diffusion pump 42, and a main valve 50. The foreline valve 44 is opened so that the foreline pump 40 can began to function. After the diffusion pump 42 is warmed or heated to an appropriate level, the main valve 50 is opened, after the roughing pump 46 has been shut in by closing the roughing valve 48. This allows the diffusion pump 42 to further reduce the pressure in the vacuum chamber 14 below a desired level.

A gas 60, such as argon, may then be introduced into the vacuum chamber 14 at a desired rate to raise the pressure in the vacuum chamber 14 to a desired pressure or to within a range of pressures. A gas control valve controls the rate of the flow of the gas 60 into the vacuum chamber 14 through the base plate 32.

Once all of the operating parameters and conditions are established, as will be described more fully below in connection with FIGS. 5 and 6 according to the teachings of the present invention, plasma plating occurs in system 10. The substrate 12 may be plasma plated with a deposited layer, which may include one or more layers such as a base layer, a transitional layer, and a working layer, through the formation of a plasma within the vacuum chamber 14. The plasma will preferably include positively charged depositant ions from the evaporated or vaporized depositant along with positively charged ions from the gas 60 that has been introduced within the vacuum chamber 14. It is believed, that the presence of the gas ions, such as argon ions, within the plasma and ultimately as part of the depositant layer, will not significantly or substantially degrade the properties of the depositant layer. The introduction of the gas into the vacuum chamber 14 is also useful in controlling the desired pressure within the vacuum chamber 14 so that a plasma may be generated according to the teachings of the present invention. In an alternative embodiment, the plasma plating process is achieved in a gasless environment such that the pressure within the vacuum chamber 14 is created and sufficiently maintained through a vacuum system.

The generation of the plasma within the vacuum chamber 14 is believed to be the result of various contributing factors such as thermionic effect from the heating of the depositant within the filaments, such as the filament 16 and the filament 18, and the application of the dc signal and the radio frequency signal at desired voltage and power levels, respectively.

The vacuum system of the system 10 may include any of a variety of vacuum systems such as a diffusion pump, a foreline pump, a roughing pump, a cryo pump, a turbo pump, and any other pump operable or capable of achieving pressures within the vacuum chamber 14 according to the teachings of the present invention.

As described above, the vacuum system includes the roughing pump 46 and the diffusion pump 42, which is used with the foreline pump 40. The roughing pump 46 couples to the vacuum chamber 14 through the roughing valve 48. When the roughing valve 48 is open, the roughing pump 46 may be used to initially reduce the pressure within the vacuum chamber 14. Once a desired lower pressure is achieved within the vacuum chamber 14, the roughing valve 48 is closed. The roughing pump 46 couples to the vacuum chamber 14 through a hole or opening through the base plate 32. The roughing pump 46 will preferably be provided as a mechanical pump. In a preferred embodiment of the vacuum system of the system 10 as shown in FIG. 1, the vacuum system in this embodiment also includes a foreline pump 40 coupled to a diffusion pump 42 through a foreline valve 44. The foreline pump 40 may be implemented as a mechanical pump that is used in combination with the diffusion pump 42 to reduce the pressure within the vacuum chamber 14 to a level even lower than that which was produced through the use of the roughing pump 46.

After the roughing pump 46 has reduced the pressure within the vacuum chamber 14, the diffusion pump 42, which uses heaters and may require the use of cooling water or some other substance to cool the diffusion pump 42, couples with the vacuum chamber 14 through a main valve 50 and through various holes or openings through the base plate 32 as indicated in FIG. 1 by the dashed lines above the main valve 50 and below the platform 20. Once the diffusion pump 42 has been heated up and made ready for operation, the main valve 50 may be opened so that the pressure within the vacuum chamber 14 may be further reduced through the action of the diffusion pump 42 in combination with the foreline pump 44. For example, the pressure within the vacuum chamber 14 may be brought below 4 milliTorr. During a backsputtering process, the pressure in the vacuum chamber 14 may be dropped to a level at or below 100 milliTorr on down to 20 milliTorr. Preferably, the pressure within the vacuum chamber 14 during a backsputtering process will be at a level at or below 50 milliTorr on down to 30 milliTorr. During normal operation of the system 10 during a plasma plating process, the pressure within the vacuum chamber 14 may be reduced by the vacuum system to a level at or below 4 milliTorr on down to a value of 0.1 milliTorr. Preferably, the vacuum system will be used during a plasma plating process to reduce the pressure within the vacuum chamber 14 to a level at or below 1.5 milliTorr on down to 0.5 milliTorr.

Figure 2:
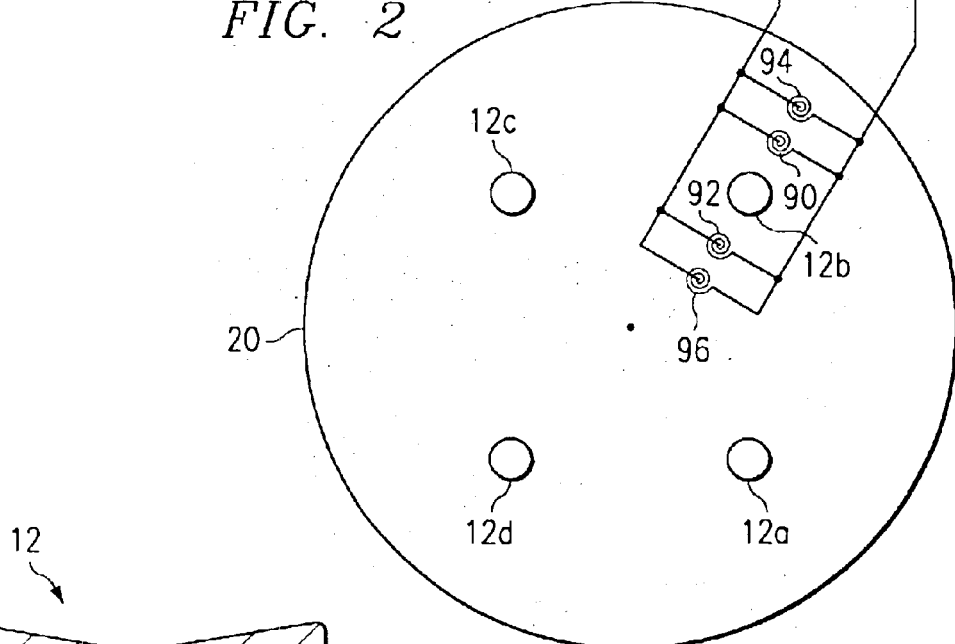
FIG. 2 is a top view of a vacuum chamber of a system for plasma plating that illustrates one embodiment of a platform implemented as a turntable.

FIG. 2 is a top view of a vacuum chamber of a system for plasma plating that illustrates one embodiment of a platform implemented as a turntable 20. The turntable 20 is shown with substrates 12a, 12b, 12c, and 12d positioned, symmetrically on the surface of the turntable 20. The turntable 20 may rotate either clockwise or counterclockwise. The substrates 12a–12d may be virtually any available material and are shown in FIG. 2 as round, cylindrical components such that the top view of each of the substrates presents a circular form.

The filament power control module 34 is electrically coupled to a first set of filaments 94 and 96 and a second set of filaments 90 and 92. Although the electrical connections are not fully illustrated in FIG. 2, it should be understood that the filament power control module 34 may supply current to the first set of filaments 94 and 96 or to the second set of filaments 90 and 92. In this manner, the deposition layer may be provided with two sublayers such as a base layer and a working layer. The base layer will preferably be applied first through depositants provided in the first set of filaments 94 and 96 while the working layer will be deposited on the base layer of the substrates 12a–12d using the depositants provided at the second set of filaments 90 and 92.

The arrangement of the substrates in FIG. 2 may be described as an array of substrates that include inwardly facing surfaces, which are closer to the center of the turntable 20, and outwardly facing surfaces, which are closer to the outer edge of the turntable 20. For example, the inwardly facing surfaces of the array of substrates 12a–d will be presented to the filament 92 and the filament 96, at different times of course, as they are rotated near the filaments. Similarly, the outwardly facing surfaces of the substrates 12a–d will be presented to the filaments 90 and 94 as they rotate near these filaments.

As mentioned previously, the filament power control module 34 may provide a current in virtually any form, such as a direct current or an alternating current, but preferably provides current as an alternating current.

In operation, turntable 20 rotates, for example, in a clockwise direction such that after substrate 12b passes near or through the filaments, the next substrate that will pass near or through the filaments is substrate 12c, and so on. In one example, the first set of filaments 94 and 96 are loaded with a depositant, such as nickel (or titanium), and the second set of filaments are loaded with a depositant such as the metal alloy silver\palladium. This example illustrates a two shot application or a two layer deposition layer.

After all of the operating parameters have been established within the vacuum chamber, as described throughout herein, the filament power control module 34 may energize or provide alternating current to the first set of filaments 94 and 96 so that the nickel will evaporate or vaporize to form a plasma with the gas, such as argon gas, within the vacuum chamber. The positively charged nickel ions and the positively charged argon ions in the plasma will be attracted to the substrates 12a–d, which are at a negative potential. Generally, the closer the substrate is to the first set of filaments 90 and 92 as it rotates, the more material will be deposited. Because the turntable is rotating, a uniform or more even layer will be applied to the various substrates.

After the first plasma has been plated onto the array of substrates 12a–d to form a base layer of the depositant layer on the substrates, the filament power control module 34 is energized so that a sufficient amount of current is provided to the second set of filaments 90 and 92. Similarly, a plasma is formed between the argon ions and the silver\palladium ions and the working layer is then formed to the substrates that are being rotated.

During the first shot when the base layer is being applied, the outwardly facing surfaces of substrates 12a–d are primarily coated through the nickel depositant located in the filament 94. Similarly, the inwardly facing surfaces of the substrates are coated by the nickel depositant located in the filament 96. The same relation holds true for the second shot where the silver\palladium is plasma plated onto the substrates to form the deposit layer.

Figure 3:
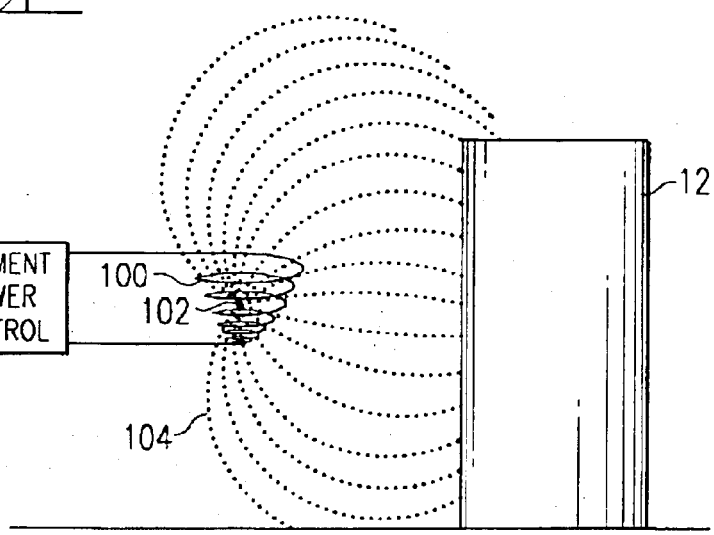
FIG. 3 is a side view that illustrates the formation and dispersion of a plasma around a filament to plasma plate a substrate according to an embodiment of the present invention.

FIG. 3 is a side view that illustrates the formation and dispersion of a plasma around a filament 100 to plasma plate a substrate 12 according to an embodiment of the present invention. The filament 100 is implemented as a wire basket, such as tungsten wire basket, and is shown with a depositant 102 located within, and mechanically supported by, the filament 100. As the filament power control module 34 provides sufficient current to the filament 100, the depositant 102 melts or vaporizes and a plasma 104 is formed. Of course, all of the operating parameters of the present invention must be present in order to achieve the plasma state so that plasma plating may take place.

The substrate 12, which is provided at a negative potential, attracts the positive ions of the plasma 104 to form a deposition layer. As is illustrated, the dispersion pattern of the plasma 104 results in most of the positive ions of the plasma 104 being attracted to the side adjacent or nearest to the filament 100 and the depositant 102. Some wrap around will occur such as that illustrated by the plasma 104 contacting the top surface of the substrate 12. Similarly, some of the positive ions of the plasma 104 may be attracted to the platform or turntable. As is illustrated, the present invention provides an efficient solution for the creation of a deposition layer by ensuring that most of the ions from the depositant are used in the formation of the deposition layer.

Figure 4:
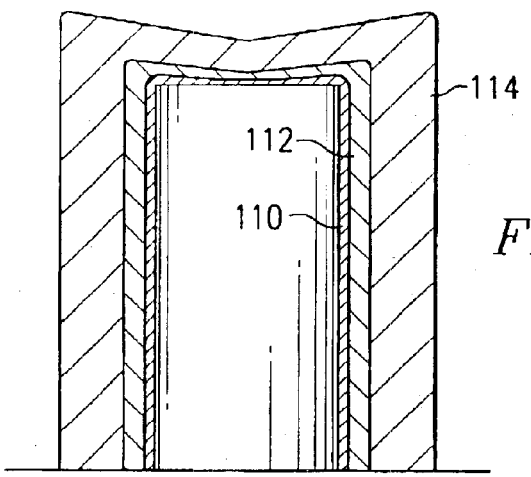
FIG. 4 is a sectional view that illustrates a deposition layer that includes a base layer, a transition layer, and a working layer.

FIG. 4 is a sectional view that illustrates a deposition layer of the substrate 12 that includes a base layer 110, a transition layer 112, and a working layer 114. It should be noted at the outset that the thickness of the various layers that form the deposition layer are grossly out of proportion with the size of the substrate 12; however, the relative thicknesses of the various sublayers or layers of the deposition layer are proportionate to one another, according to one embodiment of the present invention.

Generally, the thickness of the entire deposition layer on the substrate, according to the teachings of the present invention, are believed to generally range between 500 and 20,000 Angstroms. In a preferred embodiment, the entire thickness of the deposition layer is believed to range between 3,000 and 10,000 Angstroms. The present invention provides excellent repeatability and controllability of deposition layer thicknesses, including all of the sublayers such as the base layer 110, the transition layer 112, and the working layer 114. It is believed that the present invention can provide a controllable layer thickness at an acuracy of around 500 Angstroms. It should also be mentioned that the present invention may be used to form a deposition layer with one or any multiple of sublayers.

The thickness of the deposition layer is normally determined based on the nature of intended use of the plasma plated substrate. This may include such variables as the temperature, pressure, and humidity of the operating environment, among many other variables and factors. The selection of the desired metal or depositant type for each layer is also highly dependant upon the nature of the intended use of the plasma plated substrate.

For example, the present invention prevents or substantially reduces galling or mating or interlocking components. Galling includes the seizure of mated components that often occur when two surfaces, such as threaded surfaces, are loaded together. Galling can cause components to fracture and break, which often results in severe damage. Plasma plating may be used to prevent or reduce galling by plating one or more contacting surfaces.

Various depositants may be used to achieve this beneficial effect. It is believed, however, that galling is preferably reduced through a plasma plating process that deposits a base layer of nickel or titanium and a working layer of a silver/palladium metal alloy on one or more contacting surfaces. For high temperature applications, such as over 650 degrees Fahrenheit, it is believed that the galling is preferably reduced through a plasma plating process that deposits a nickel or titanium base layer and a working layer of gold.

It has been found through experimentation that chromium does not work well to reduce galling, this includes when the chromium is deposited as either the base layer, the transition layer, or the working layer. It is believed that chromium may be a depositant that is more difficult to control during the plasma plating process.

Plasma plating may also be used to plate valve parts, such as valve stems in nonnuclear applications, and are preferably plasma plated using a titanium base layer, a gold transition layer, and an indium working layer. In nuclear applications, such as nuclear power plant applications, indium is not a preferred plasma plating depositant because it is considered to be too much of a radioactive isotope absorber. Instead, valve stems in nuclear applications are preferably plasma plated using a nickel base layer and a silver/palladium metal alloy working layer.

As is illustrated in FIG. 4, the working layer 14 is normally provided at a substantially larger thickness than the corresponding transition layer 112 and the base layer 110. It should also be noted that the coating of the top of the substrate 12 is shown to be thin at or near the center or middle of the substrate 12. This effect is due to how the filaments are positioned during the plasma plating process. For example, if the filaments are positioned similarly to that illustrated in FIGS. 2–3, the middle or center portion of the substrate 12 will generally have a thinner overall profile than the side of the deposition layer.

Although various ranges of thicknesses have been discussed herein, it should be understood that the present invention is not limited to any maximum deposition layer thickness. The thickness of the deposition layer, especially the thickness of the working layer 114, can be provided at virtually any desired thickness, normally depending upon the operating environment in which the plasma plated substrate 12 will be introduced. The base layer 110 and the transition layer 112 and any other layers below the working layer 114 will preferably be provided at a substantially smaller thickness than the corresponding thickness of the working layer 114. For example, the base layer 110 and the transition layer 112 may be provided at a thickness ranging from 500 to 750 Angstroms while the working layer 114 may be provided at virtually any thickness such as for example 18,000 Angstroms.

Figure 5:
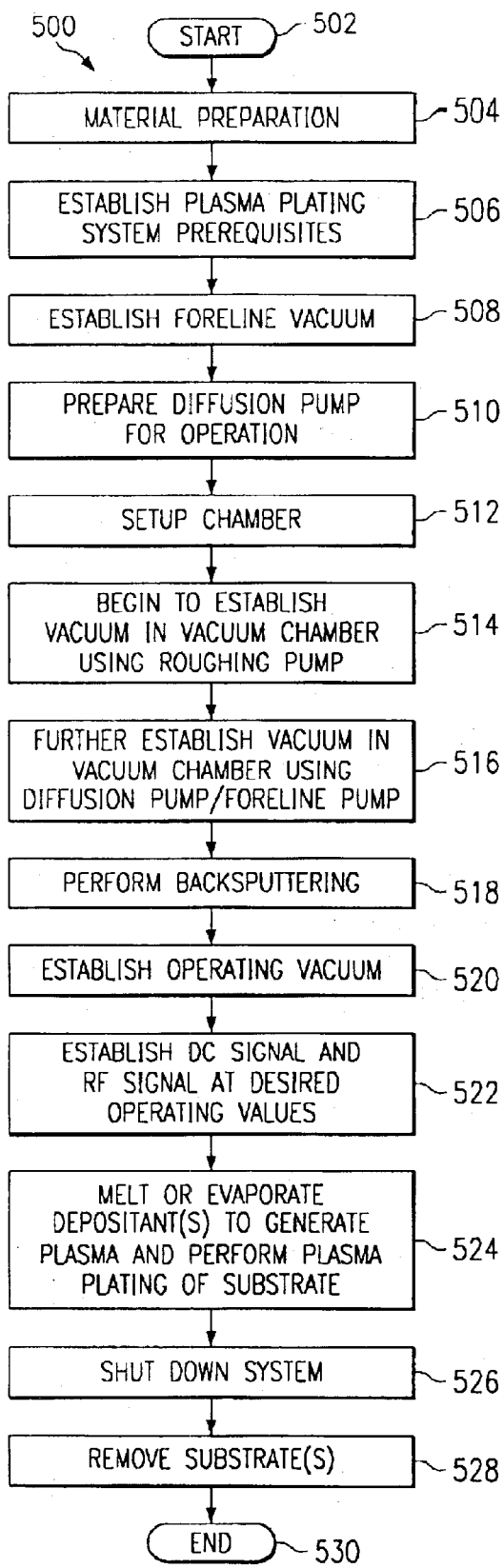
FIG. 5 is a flowchart that illustrates a method for plasma plating according to an embodiment of the present invention.

FIG. 5 is a flow chart of a method 500 for plasma plating according to an embodiment of the present invention. The method 500 begins at block 502 and proceeds to block 504. At block 504, the material or substrate that will be plasma plated is prepared for the process. This may include cleaning the substrate to remove any foreign materials, contaminants, and oils. Any of a variety of known cleaning processes may be used such as those defined by the Steel Structures Painting Council (SSPC). For example, the SSPC-5 standard may be employed to ensure that a substrate is cleaned to a white metal condition. Similarly, the SSPC-10 standard may be employed. Preferably, the substrate will undergo an abrasive blasting, such as for example, bead blasting to further ensure that any foreign materials or contaminants are removed. It should be noted that an oxidation layer may be present on the surface of the substrate. The present invention allows for a deposition layer to be plasma plated onto the substrate surface, even in the presence of an oxidation layer, with excellent adhesion and mechanical properties.

The method 500 proceeds next to block 506 where the plasma plating system prerequisites are established.

Depending upon the implementation of the system for plasma plating, this may involve any of a variety of items. In the situation where a diffusion pump is used as part of the vacuum system, items such as the availability of cooling water must be established. Similarly, the adequate availability of lube oil and air to operate the various equipment, valves, and machinery associated with the system for plasma plating must be established. An adequate supply of gas, such as argon gas, should also be verified and checked at this point before proceeding to block 510.

At block 510, assuming that a diffusion pump is used as part of the vacuum system, the diffusion pump is prepared for operation. This may include opening a foreline valve and the starting of the foreline vacuum pump which is used in combination with the diffusion pump. Once a foreline vacuum has been drawn, the heaters of the diffusion pump may be energized. This places the diffusion pump in service.

The method 500 proceeds next to block 512 where the vacuum chamber is set up. This includes any number of processes such as positioning the substrate within the vacuum chamber. This is normally achieved by positioning or placing the substrate at a specified location on a platform or turntable located within the vacuum chamber. Before accessing the internal volume of the vacuum chamber, the vacuum chamber seal must be broken and the bell jar or outer member is preferably lifted away from its base plate. Once the substrate is positioned on the platform, the filaments may be positioned relative to the placement of the substrate.

The positioning of the filaments may involve any number of techniques and includes such variables as the amount and type of depositant to be provided at the filament, and the distance, not only relative to the substrate, but relative to other filaments. Generally, the filament will be located a distance ranging from 0.1 inches to 6 inches from the substrate, as measured from the center line of the filament, or from the depositant, to the closest point of the substrate. Preferably, however, the distance between the filament or the depositant and the substrate will range anywhere from 2.75 inches to 3.25 inches when the depositant will serve as the base layer or transition layer of the deposition layer. Similarly, when the depositant will serve as the working layer of the deposition layer that will be deposited on the substrate, the distance between the filament or the depositant and the substrate is preferably provided at a distance between 2 inches and 2.5 inches.

In the situation where multiple depositants or multiple shots will be performed in the plasma plating process, it is necessary to consider the placement of the filaments that will hold the first depositant relative to those that will hold the second depositant as well as each of the filament's position relative to each other and the substrate. Generally the distance of a second filament from a first filament, which will include a depositant that will serve as a base layer, transition layer, or a working layer of a deposition layer, should be anywhere between 0.1 inches and 6 inches.

The spacing between filaments that include depositants that will serve as a base layer, is generally provided between 0.1 inches and 6 inches. Preferably, this distance shall be between 3 inches and 4 inches. The foregoing filament spacing information also applies when the depositant provided in the filaments will serve as the transition layer in the deposition layer. Similarly, the spacing between filaments, which will include a depositant that will serve as the working layer of the deposition layer, should generally be between 0.1 inches and 6 inches, but, preferably, will be between 2.5 inches and 3 inches.

The chamber setup of block 512 may also need to take into account the arrangement of an array of substrates on the platform that are being plasma plated. For example, a filament that is positioned in the vacuum chamber so that it will provide a dispersion pattern to provide depositant coverage to inwardly facing surfaces of an array of substrates, it may require anywhere from 20 to 80 percent less mass or weight of depositant when compared with a filament positioned in the vacuum chamber to provide coverage for the array of outwardly facing surfaces. The reference to inwardly and outwardly are relative to the platform or turntable with inwardly referring to those surfaces closer to the center of the platform or turntable. This is because the efficiency of the plasma plating process is greater for the inwardly facing surfaces of an array of substrates than at the outwardly facing surfaces of the array of substrates because of the forces attracting the, generally, positive ions of the plasma. This also ensures that the thickness of the deposition layer on the inwardly facing surfaces and the outwardly facing surfaces are more uniform. In such a case, the weight or mass of the depositant will, preferably, need to vary between such filament positions. Generally, the variance in mass or weight between the two locations may be anywhere from 20 to 80 percent different. Preferably, the depositants in the filaments covering the inwardly facing surfaces will use 40 to 50 percent less mass or weight than the depositants of the filaments covering the outwardly facing surfaces. The amount of the depositant placed in the filaments corresponds to the desired thickness of the deposition layer, and any sublayers thereof. This was discussed more fully and is illustrated more fully in connection with FIG. 3.

The type of filament affects the dispersion pattern achieved through the melting or evaporation of its depositant during the creation of the plasma. Any of a variety of filament types, shapes, and configurations may be used in the present invention. For example, the filament may be provided as a tungsten basket, a boat, a coil, a crucible, a ray gun, an electron beam gun, a heat gun, or as any other structure, such as a support structure provided within the vacuum chamber. The filaments are generally heated through the application of an electric current through the filament. However, any method or means of heating the depositant within the filament may be used in the present invention.

The setup of the vacuum chamber also includes placing the depositants in the one or more filaments. The present invention contemplates the use of virtually any material that is capable of being evaporated under the conditions and parameters of the present invention so that a plasma will form. For example, the depositant may include virtually any metal, such as a metal alloy, gold, titanium, chromium, nickel, silver, tin, indium, lead, copper, palladium, silver/palladium and any of a variety of others. Similarly, the depositant may include any other materials such as carbon, nonmetals, ceramics, metal carbides, metal nitrates, and any of a variety of other materials. The depositants will generally be provided in a pellet, granule, particle, powder, wire, ribbon, or strip form. Once the filaments have been properly positioned and loaded, the vacuum chamber may be closed and sealed. This may include sealing the bell portion of the vacuum chamber with its base plate.

The method 500 proceeds next to block 514 where preparations are made to begin establishing a vacuum condition within the vacuum chamber. In one embodiment, such as the system 10 shown in FIG. 1, a roughing pump is started to begin evacuating the vacuum chamber and to bring the pressure down within the vacuum chamber to a sufficient level so that additional pumps may take over to further reduce the pressure within the vacuum chamber. In one embodiment, the roughing vacuum pump is a mechanical pump that may be started, and a roughing valve may then be opened to provide access to the vacuum chamber. Once the roughing vacuum pump has achieved its desired function and has reduced the pressure in the vacuum chamber to its desired or designed level, the roughing valve is shut. At this point, the method 500 transitions to block 516.

At block 516, the pressure within the vacuum chamber is further reduced using another vacuum pump. For example, in one embodiment, a diffusion pump/foreline pump is utilized to further reduce the pressure within the vacuum chamber. In the embodiment of the present invention as illustrated in FIG. 1, this is achieved by opening the main valve and allowing the diffusion pump, supported by the mechanical foreline pump, to further pull or reduce the pressure in the vacuum chamber.

Generally, the pressure in the vacuum chamber is reduced to a level that is at or below 4 milliTorr. Preferably, the pressure in the vacuum chamber is reduced to a level that is at or below 1.5 milliTorr. In the event that backsputtering, which is described below in connection with block 518 of the method 500, is to be performed, the pressure in the vacuum chamber is reduced to a level below 100 milliTorr and generally in a range between 20 milliTorr and 100 milliTorr. In a preferred embodiment when backsputtering is to be performed, the pressure is reduced in the vacuum chamber at a level below 50 milliTorr, and generally at a level between 20 milliTorr and 50 milliTorr.

Preceding next to block 518, a backsputtering process may be performed to further clean and prepare the substrate. It should be understood, however, that such a process is not mandatory. The backsputtering process is described in more detail below in connection with FIG. 6. The backsputtering process may include the rotation of the platform or turntable within the vacuum chamber. In such a case, the turntable will generally be rotated at a rate at or between 5 revolutions per minute and 30 revolutions per minute. Preferably, the turntable will be rotated at a rate between 12 revolutions per minute and 15 revolutions per minute. The operation of the turntable, which also will preferably be used as the deposition layer is being formed on the substrate according to the teachings of the present invention.

Method 500 proceeds next to block 520 where an operating vacuum is established. Although a vacuum condition has already been established within the vacuum chamber, as previously discussed in connection with block 514 and 516, an operating vacuum can now be established through the introduction of a gas into the vacuum chamber at a flow rate that will raise the pressure in the vacuum chamber to a level generally at or between 0.1 milliTorr and 4 milliTorr. Preferably, the introduction of the gas is used to raise the pressure in the vacuum chamber to a level that is at or between 0.5 milliTorr and 1.5 milliTorr. This will ensure that there are no depositant ion collisions within the plasma, which will increase the depositant efficiency and provide a clean, highly adhered deposition layer to the substrate. The gas that is introduced into the vacuum chamber may be any of a variety of gases but will preferably be provided as an inert gas, a noble gas, a reactive gas or a gas such as argon, xenon, radon, helium, neon, krypton, oxygen, nitrogen, and a variety of other gases. It is desirable that the gas is a noncombustible gas. It should be understood that the present invention does not require the introduction of a gas but may be performed in the absence of a gas.

At block 522, various operating parameters and values of the system are established. This will generally include the rotation of a turntable, if desired, the application of a dc signal, and the application of a radio frequency signal. Assuming that the platform includes a turntable or some other rotating device, the turntable rotation will preferably be established at this point. This assumes, of course, that the rotation of the turntable was not previously started and the discretionary backsputtering block 518. Once the rotation of the turntable has been established, the dc signal and the rf signal may be applied to the substrate. The application of the dc signal to the substrate will generally be provided at a voltage amplitude that is at or between one volt and 5,000 volts. Note that the polarity of the voltage will preferably be negative; however, this is not always required. In a preferred embodiment, the application of the dc signal to the substrate will be provided at a voltage level at or between negative 500 volts and negative 750 volts.

The application of the radio frequency signal to the substrate will generally be provided at a power level that is at or between 1 watt and 50 watts. Preferably, the power level of the radio frequency signal will be provided at 10 watts or between a range defined by 5 watts and 15 watts. The frequency of the radio frequency signal will generally be provided at an industrial specified frequency value in either the kilohertz range or the megahertz range. Preferably, the frequency signal will be provided at a frequency of 13.56 kilohertz. Although the term radio frequency has been used throughout to describe the generation and application of the radio frequency signal to the substrate, it should be understood that the term radio frequency should not be limited to its commonly understood definition of signals having frequencies roughly between 10 kilohertz and 100,000 megahertz. The term radio frequency shall also include any signal with a frequency component that is operable or capable of assisting with the creation or excitation of a plasma in a vacuum chamber.

Block 522 will also preferably include the mixing of the dc signal and the radio frequency signal, using mixer circuitry, to generate a mixed signal. This allows only one signal to be applied to the substrate. This is generally achieved using the electrical feed through that extends through the base plate of the vacuum chamber and contacts an electrically conductive portion of the platform, which in turn electrically couples to the substrate or substrates. Block 522 may also include the balancing of the mixed signal through the use of a radio frequency balancing network. Preferably, the mixed signal is balanced by minimizing the standing wave reflected power. This is preferably controlled through a manual control.

As the output or load characteristics of the antenna or output changes, as seen from the mixer circuitry, problems can arise when electrical signals or waves are reflected from the output load back to the mixer or source. These problems may include damage to the radio frequency transmitter and a reduction in the transfer of power to the substrate and vacuum chamber to ensure the formation of a sufficient plasma to achieve a successful plasma plating process.

This problem can be reduced or solved by including the radio frequency balancing network that can adjust its impedance, including in one embodiment its resistance, inductance, and capacitance, to match or reduce the presence of reflected waves. The impedance and electrical characteristics of the output load or antenna are affected by such things as the presence and/or absence of a plasma and the shape and properties of the substrate or substrates on the platform. Because of such changes during the plasma plating process, the radio frequency balancing network may need to be adjusted during the process to minimize the standing wave reflected power or, stated differently, to prevent or reduce the standing wave ratio return to the radio frequency transmitter. Preferably, these adjustments are performed manually by an operator during the plasma plating process. In other embodiments, the radio frequency balancing network is automatically adjusted. Care must be taken, however, to ensure that the automatic adjustment does not over compensate or poorly track the changes in the output load.

The method 500 proceeds next to block 524 where the depositant or depositants are melted or evaporated so that a plasma will be generated. The generation of the plasma at the conditions provided by the present invention will result in a deposition layer being formed on the surface of the substrate through plasma plating. It is believed that the deposition layer is formed at a medium energy level on the average of between 10 eV and 90 eV.

The depositants are generally evaporated or vaporized by providing a current through the filament around the depositant. In a preferred embodiment, the depositants are slowly or incrementally heated to achieve a more even heat distribution in the depositant. This also improves the formation of the plasma. The current may be provided as an alternating current or as any other current that is sufficient to generate heat in the filament that will melt the depositant. In other embodiments, the depositant may be heated through the introduction of an agent that is in chemical contact with the depositant. In still other embodiments, the depositant may be heated through the use of electromagnetic or microwave energy.

The conditions in the vacuum chamber will be correct for the formation of a plasma. The plasma will generally include gas ions, such as argon ions, and depositant ions, such as gold, nickel, or palladium ions. The gas ions and the depositant ions will generally be provided as positive ions due to the absence of one or more electrons. The creation of the plasma is believed to be assisted through the introduction of the radio frequency signal and because of thermionic phenomena due to the heating of the depositants. It is contemplated that in some situations, a plasma may be generated that includes negatively charged ions.

The negative potential established at the substrate due to the dc signal will attract the positive ions of the plasma. Once again, this will primarily include depositant ions and may include gas ions, such as argon gas ions from the gas that was introduced earlier in method 500. The inclusion of the gas ions, such as argon ions, are not believed to degrade the material or mechanical characteristics of the deposition layer.

It should be noted that some prior literature has suggested that the introduction of a magnet at or near the substrate is desirable to influence the path of the ions of the plasma as they are attracted to the substrate to form the deposition layer. Experimental evidence now suggests that the introduction of such a magnet is actually undesirable and produced unwanted effects. The presence of the magnet may lead to uneven deposition thicknesses, and prevent or significantly impede the controllability, repeatability, and reliability of the process.

Whenever the deposition layer is designed to include multiple sublayers, multiple shots must be performed at block 524. This means that once the base layer depositants have been melted through the heating of their filaments, the transition layer depositants (or the depositant of the next layer to be applied) are heated and melted by the introduction of heat at their filaments. In this manner, any number of sublayers may be added to the deposition layer. Before successive depositant sublayers are formed, the preceding layer shall have been fully or almost fully formed. The method 500 thus provides the significant advantage of allowing a deposition layer to be created through multiple sublayers without having to break vacuum and reestablish vacuum in the vacuum chamber. This can significantly cut overall plasma plating time and costs.

The method 500 proceeds next to block 526 where the process or system is shut down. In the embodiment of the system shown in FIG. 1, the main valve is closed and a vent valve to the vacuum chamber is opened to equalize pressure inside the vacuum chamber. The vacuum chamber may then be opened and the substrate items may be immediately removed. This is because the method 500 does not generate excessive heat in the substrates during the plasma plating process. This provides significant advantages because the material or mechanical structure of the substrate and deposition layer are not adversely affected by excessive temperature. The plasma plated substrates may then be used as needed. Because the temperature of the substrates are generally at a temperature at or below 125 Fahrenheit, the substrates can generally be immediately handled without any thermal protection.

The method 500 provides the additional benefit of not generating any waste byproducts and is environmentally safe. Further, the method 500 is an efficient process that efficiently uses the depositants such that expensive or precious metals, such as gold and silver, are efficiently utilized and are not wasted. Further, due to the fact that the present invention does not use high energy deposition techniques, no adverse metallurgical or mechanical effects are done to the substrate. This is believed to be due to the fact that the deposition layer of the present invention is not deeply embedded within the substrate, but excellent adherence, mechanical, and material properties are still exhibited by the deposition layer. After the substrates have been removed at block 528, the method 500 ends at block 530.

Figure 6:
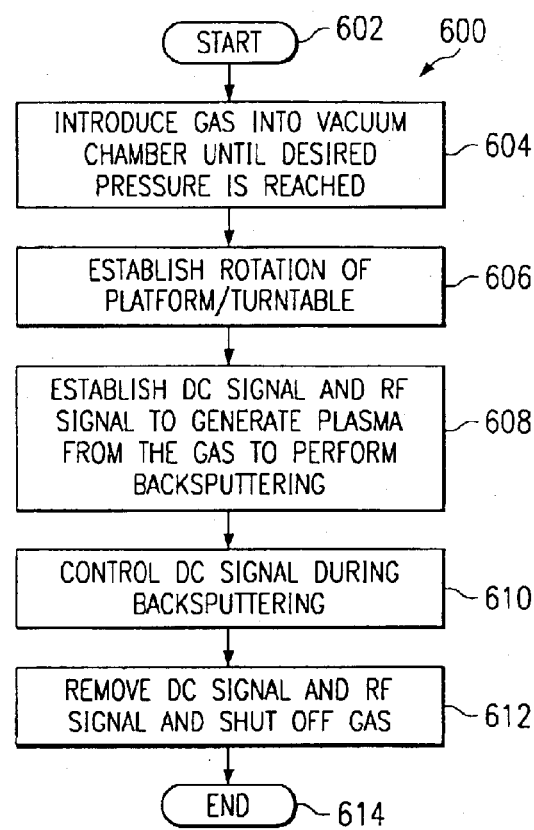
FIG. 6 is a flowchart that illustrates a method for backsputtering using the system of the present invention, according to an embodiment of the present invention.

FIG. 6 is a flow chart of a method 600 for backsputtering using the system and method of the present invention, according to an embodiment of the present invention. As mentioned previously, backsputtering may be used to further clean the substrate before a deposition layer is formed on the substrate through plasma plating. Backsputtering generally removes contaminants and foreign materials. This results in a cleaner substrate which results in a stronger and more uniform deposition layer. The method 600 begins at block 602 and proceeds to block 604 where a gas is introduced into the vacuum chamber at a rate that maintains or produces a desired pressure within the vacuum chamber. This is similar to what was previously described in block 520 in connection with FIG. 5. Generally, the pressure in the vacuum chamber should be at a level at or below 100 milliTorr, such as at a range between 20 milliTorr and 100 milliTorr. Preferably, the pressure is provided at a level at or between 30 milliTorr and 50 milliTorr.

The method 600 proceeds next to block 606 where rotation of the platform or turntable is established, if applicable. As mentioned previously, the rotation of the turntable may be provided at a rate between 5 revolutions per minute and 30 revolutions per minute but is preferably provided at a rate between 12 revolutions per minute and 15 revolutions per minute.

Proceeding next to block 608, a dc signal is established and is applied to the substrate. The dc signal will generally be provided at an amplitude at or between one volt and 4,000 volts. Preferably, the dc signal will be provided at a voltage between negative 100 volts and negative 250 volts.

Block 608 also involves the generation of a radio frequency signal that will be applied to the substrate. The radio frequency signal will generally be provided at a power level at or between 1 watt and 50 watts. Preferably, the radio frequency signal will be provided at a power level of 10 watts or at or between 5 and 15 watts. The dc signal and the radio frequency signal are preferably mixed, balanced, and applied to the substrate as a mixed signal. As a consequence, a plasma will form from the gas that was introduced at block 604. This gas will generally be an inert gas or noble gas such as argon. The formation of the plasma includes positive ions from the gas. These positive ions of the plasma will be attracted and accelerated to the substrate, which will preferably be provided at a negative potential. This results in contaminants being scrubbed or removed from the substrate. Once the contaminants or foreign matter are removed from the substrate, they are sucked out of the vacuum chamber through the operation of the vacuum pump, such as the diffusion pump.

Proceeding next to block 610, the backsputtering process continues for a period of time that is generally between 30 seconds and one minute. Depending on the condition and cleanliness of the substrate, the backsputtering process may continue for more or less time. Generally, the backsputtering process is allowed to continue until the capacitance discharge, created by the backsputtering process is substantially complete or is significantly reduced. This may be visually monitored through the observation of sparks or light bursts that coincide with the capacitive discharge from the contaminants from the substrate. This may be referred to as microarcing.

During the backsputtering process, the dc signal must be controlled. This is normally achieved through manual adjustments of a dc power supply. Preferably, the voltage of the dc signal is provided at a level that allows the voltage to be maximized without overloading the dc power supply. As the backsputtering process continues, the current in the dc power supply will vary because of changes in the plasma that occur during the backsputtering process. This makes it necessary to adjust the voltage level of the dc signal during the backsputtering process.

The method 600 proceeds next to block 612 where the dc signal and the radio frequency signal are removed and the gas is shut off. The method 600 proceeds next to block 614 where the method ends.

Figure 7:
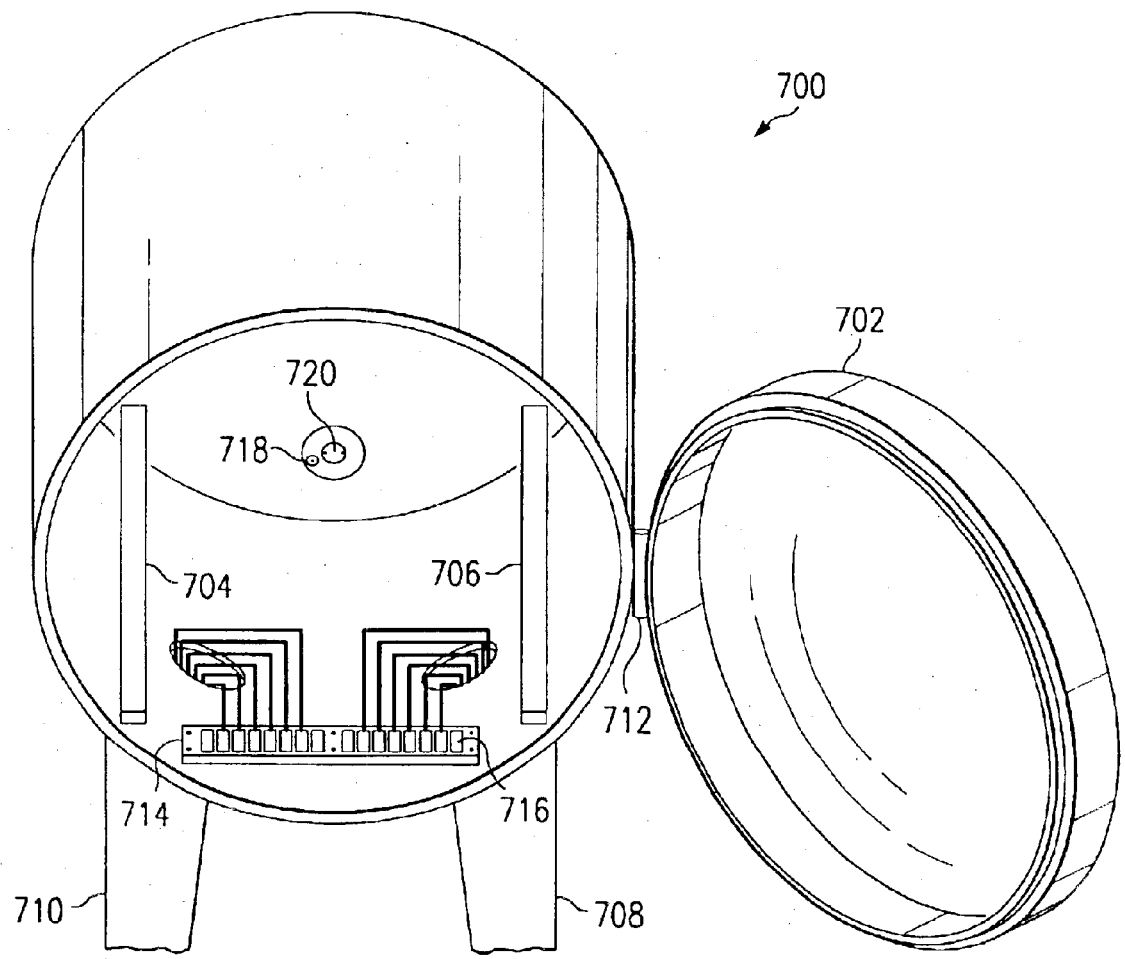
FIG. 7 is a front view of a vacuum chamber for use in a configurable vacuum system according to one embodiment of the present invention.

FIG. 7 is a front view of a vacuum chamber 700 for use in a configurable vacuum system according to an embodiment of the present invention. The vacuum chamber 700 is shown as a cylindrical type vacuum chamber with a vacuum chamber door 702 hingeably mounted to the main opening of the vacuum chamber 700, and a leg 710 and a leg 708 positioned to support the vacuum chamber 700. The hingeable coupling or connection between the vacuum chamber door 702 to the main opening of the vacuum chamber 700 is illustrated by hinge 712. The vacuum chamber 700 may be made of any of a variety of materials such as, for example, metal, steel, or a composite. A railing 704 and a railing 706 are shown within the internal volume of the vacuum chamber 700 and are illustrated mounted or coupled to the internal walls of the vacuum chamber 700. These railings are used to support a vacuum table assembly that may be slid in or rolled into the internal volume of the vacuum chamber 700 using or while supported by the railing 704 on one side and the railing 706 on the other.

Various types of connectors may also be provided within the interior of vacuum chamber 700 to couple with various connectors of the vacuum table assembly. These connectors allow electric power (or current), electrical signals, and mechanical power, for example, to be provided to the vacuum table assembly during the plating process and when vacuum conditions exist within the vacuum chamber 700. These connections may be automatically made when the vacuum table assembly is positioned within the internal volume of the vacuum chamber 700. This may significantly increase overall productivity of the plating process by allowing various plating or coating batches to be efficiently and quickly performed.

The connections may, for example, and as was discussed previously in relation to FIG. 1, during a plasma plating process provide a current to the various filaments of the vacuum table assembly that contain depositants so that the depositants can be heated and evaporated during plating. This current may be generated and provided by a filament power control module, as shown in FIG. 1. Similarly, if the vacuum table assembly needs mechanical energy, such as rotational motion at a substrate, connections may provide such mechanical power from outside to within the vacuum chamber to provide the needed rotation. If the vacuum table assembly requires an electrical signal, such as that provided by the electrical feed through 26 as shown in FIG. 1 and described previously, connections and conductors may provide such a path. The vacuum chamber 700 provides interfaces or connectors for electrical power, electrical signals, and mechanical power so that external sources of such power and signals can be provided to the internal volume of the vacuum chamber 700 during a deposition process from external sources.

Examples of such connectors or couplings are shown within the vacuum chamber 700. A filament power connector 714 is shown towards the bottom of the vacuum chamber 700 and includes various conductors that electrically couple with various contact pads, such as a filament power contact pad 716 as illustrated in FIG. 7. Each of the various contact pads of the filament power connector 714 will, preferably, automatically couple with a corresponding contact pad of the vacuum table assembly when it is inserted into the vacuum chamber 700. The power may then be routed to various filaments, filament power conductors, which, preferably, provide mechanical support to the filaments and may be positioned in any of a number of arrangements on the vacuum table assembly. A electrical feed through connector 718 is shown along with a mechanical drive connector 720 at the back and within the vacuum chamber 700.

When the vacuum table assembly slides or fits within the vacuum chamber 700, it will contain corresponding connectors that will preferably, automatically couple to these connectors with corresponding mating connectors. The mechanical drive connector 720 provides mechanical rotational energy to a mechanical drive or drive shaft of the vacuum table assembly. The electrical feed through connector 718 provides an electrical coupling to an electrical feed through, similar to the electrical feed through 26 that was shown and illustrated in connection with FIG. 1. Ultimately, this provides a conductive path so that an electrical signal, such as a dc/rf signal, can be provided to the vacuum table assembly during plating and while vacuum conditions exist in the vacuum chamber 700. For example, the electrical signal may be a dc/rf signal, which is ultimately provided at the substrate, when the coating or plating process used is plasma plating.

Figure 8:
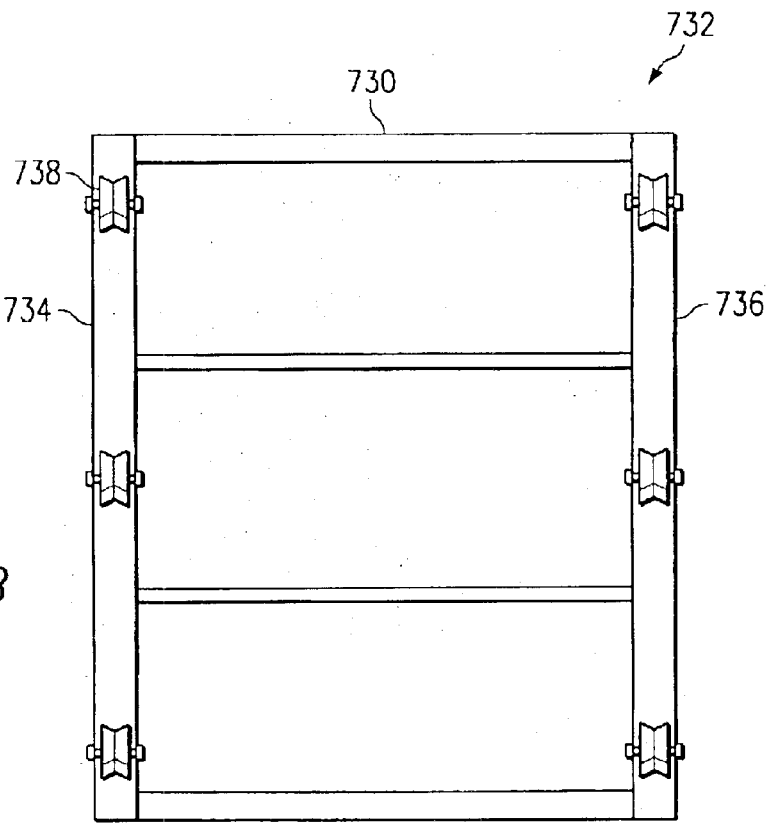
FIG. 8 is a bottom view of a support frame of a vacuum table assembly according to one embodiment of the present invention.

FIG. 8 is a bottom view of a support frame 730 that may be used in a vacuum table assembly 732 according to one embodiment of the present invention. The support frame 730 may be provided in virtually any available structure and arrangement. For example, the support frame 730 may be implemented using unistruts that include both horizontal and vertical members. On a first parallel side 734 one or more wheels may be mounted such as wheel or roller 738. Similarly, a second parallel side may include various wheels or rollers as is illustrated in FIG. 8. These wheels or rollers will assist in placing, sliding, or rolling the vacuum table assembly 732 into the vacuum chamber 700. For example, the rollers or wheels of the first parallel side 734 and the second parallel side 736 may be provided at the railing 704 and the railing 706, respectively, of the vacuum chamber 700. This greatly assists with the plating process.

Figure 9:
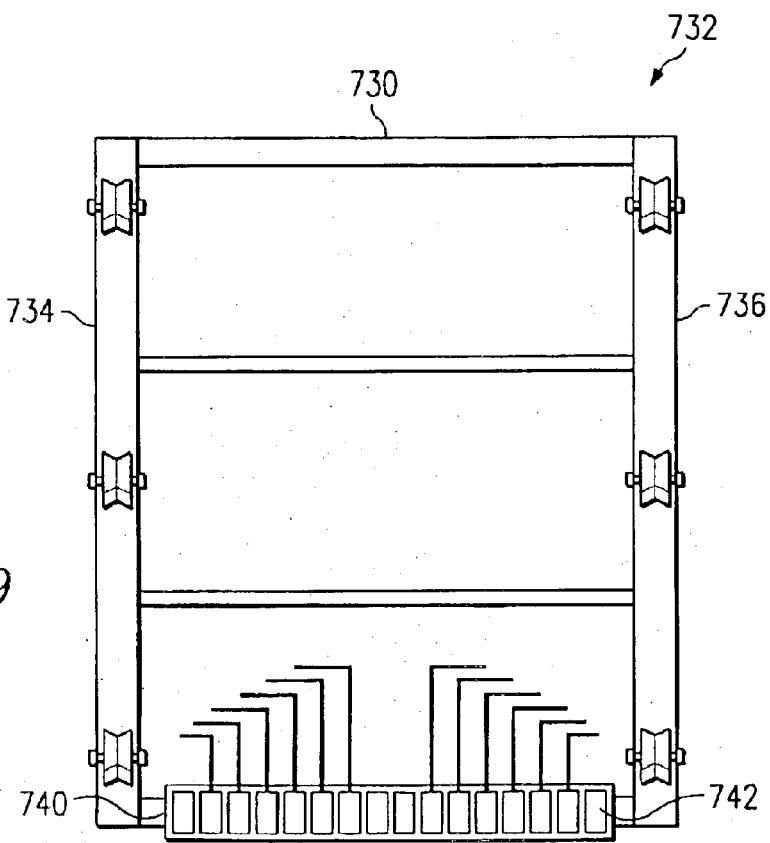
FIG. 9 is a bottom view of the support frame as shown and illustrated in FIG. 8 with the addition of a filament power connector coupled to the support frame.

FIG. 9 is a bottom view of the support frame 730 as shown and illustrated in FIG. 8 with the addition of a filament power connector 740 coupled or positioned relative to the support frame 730. When the vacuum table assembly 732 is wheeled or slid into the vacuum chamber 700, the filament power connector 740 may couple, preferably, automatically to the filament power connector 714 as illustrated in FIG. 7. Similarly, all of the various contacts of the two filament power control connectors 740 and 714 will mate or couple. This may be achieved in a preferred embodiment using spring-loaded contact pads such as a filament power contact pad 742 and the filament contact pad 716 as shown in FIG. 7.

Figure 10:
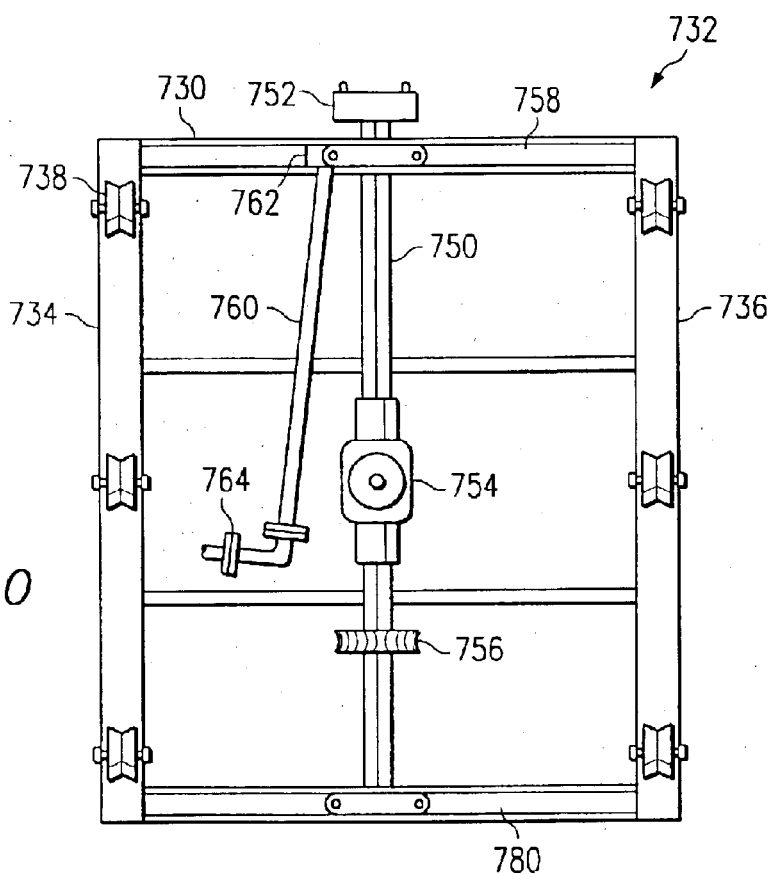
FIG. 10 is a bottom view of the support frame as shown and illustrated in FIG. 8 with the addition of a mechanical drive coupled to the support frame and an electrical feed through coupled to the support frame according to an embodiment of the present invention.

FIG. 10 is a bottom view of the support frame 730 as shown and illustrated in FIG. 8 with the addition of a mechanical drive 750 coupled to the support frame 730 and an electrical feed through 760 coupled to the support frame or positioned on or near the support frame according to an embodiment of the present invention. The filament power connector 740, as was illustrated in FIG. 9, is not shown in FIG. 10 in order to simplify the discussion and understanding of the vacuum table assembly 732.

Focusing on the mechanical drive 750, a mechanical drive connector 752 is shown at one end. This will couple to the corresponding mechanical drive connector 720 of the vacuum chamber 700 when the vacuum table assembly 732 is positioned within the vacuum chamber 700. The mechanical drive 750 is shown as a shaft that is mounted to a cross-member 758 and a cross-member 780 of the support frame 730. The mechanical drive 750 is also shown positioned generally within the center of the support frame 730 but, in other embodiments, it may be offset to one side or the other. The mechanical drive 750 receives rotational mechanical energy at the mechanical drive connector 752 such that the mechanical drive 750 shaft rotates. This rotational energy may rotate a gearbox 754 which translates the rotational energy of the mechanical drive 750 into a second rotational energy operable to drive the rotation of a platform, not shown in FIG. 10. The platform or turntable will preferably be mounted on the other side or the top of the support frame 730. The substrate that is to be plated will generally be placed on the platform. The gearbox 754 may use a drive assembly, such as a belt drive or direct drive to couple with the bottom of the platform.

A gear 756 may also be provided on the mechanical drive 750 such that the rotation of the mechanical drive 750 also rotates the gear 756. The gear 756 may be implemented, in another embodiment, as a pulley that uses a belt to drive a platform that is implemented as a roller. This will be illustrated more fully below. The gear 756, just like the gearbox 754, provides rotational energy to a platform so that a substrate may be rotated as desired.

Focusing now on the electrical feed through 760, an electrical feed through connector 762 is shown at cross-member 758. The electrical feed through connector 762 will, preferably, automatically couple with the electrical feed through connector 718 of the vacuum chamber 700. The electrical feed through 760 provides an electrical or conductive path so that an electrical signal, such as a dc/rf signal, may be provided ultimately to a substrate to assist with plating, such as when plasma plating is used. A second end 764 of the electrical feed through 760 may include a commutator, such as a brush or spring-loaded roller so that an electrical path is provided to the substrate that is being plated. The commutator, such as when the spring-loaded roller is used, may directly contact the substrate as it is being rotated, or the commutator may electrically contact a platform, such as a turntable or conductive plate so that an electrical path is provided to the substrate during plating, thus allowing the electrical signal to be provided at the substrate as desired.

Figure 11:
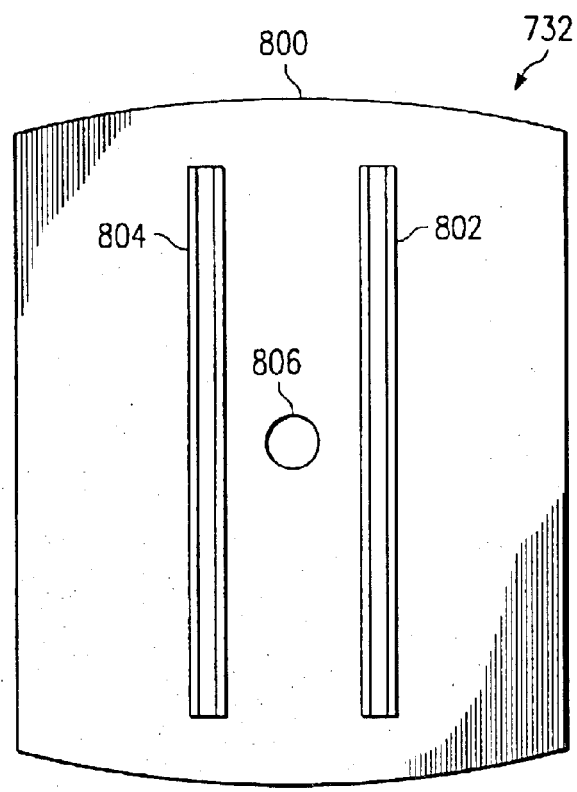
FIG. 11 is a top view of an insulated surface positioned between the support frame and two support members, as shown, of the vacuum table assembly according to one embodiment of the present invention.

FIG. 11 is a top view of an insulated surface 800 positioned on the support frame 730, and two support members 802 and 804 of the vacuum table assembly 732. The support frame 730 is not visible from this view. The insulated surface 800 may be implemented using virtually any known or available material such as micarta. Preferably, the insulated surface 800 provides some level of rigidity and mechanical support so that filament rods, bars or conductors may be mounted through the insulated surface 800 so that various filaments may be positioned as desired on the top of the insulated surface 800. The insulated surface 800 is also shown with an opening 806 provided through its surface. It should be noted that any of a variety of openings or holes may be provided as desired and needed through the insulated surface 800. This allows for mechanical and electrical feed throughs to be provided from the bottom of the insulated surface 800 to the top of the surface of the insulated surface 800. For example, the mechanical drive 750 and the electrical feed through 760 will ultimately be provided through an opening in the insulated surface 800.

The support member 802 and support member 804 are used to provide a support structure so that any of a variety of various platforms may be mounted on the top of the vacuum table assembly 732. In one embodiment, the support members 802 and 804 are implemented as metal unistrut members that are coupled to the support frame 730 on the bottom side of the insulated surface 800. The unistrut provides valuable versatility and coupling various platforms such as turntables, rollers, and conductive plates, to the vacuum table assembly 732.

The bottom side of the insulated surface 800 will, preferably, provide any of a variety of conductive paths or wires so that the filament power contact pads of the filament power connector 714 will couple through such conductors or paths to a desired location on the insulated surface 800. Holes or openings will then be made in the insulated surface 800 so that filament conductors may be provided through such holes, while still electrically coupled to the filament power connector 714. This allows filaments to be positioned as desired and virtually anywhere on the top surface of the insulated surface 800.

Figure 12A:
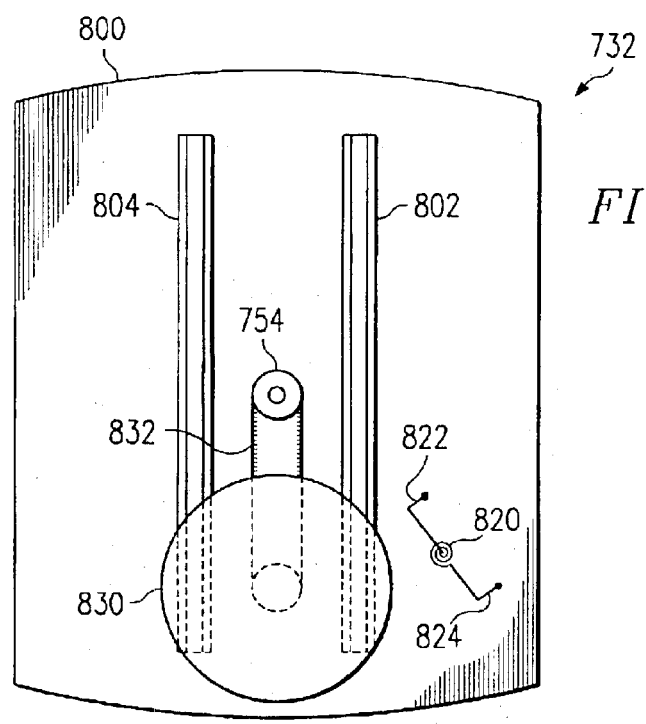
FIGS. 12a–b is a top and side view of the vacuum table assembly with a platform implemented as a turntable and a filament positioned as desired.
Figure 12B:
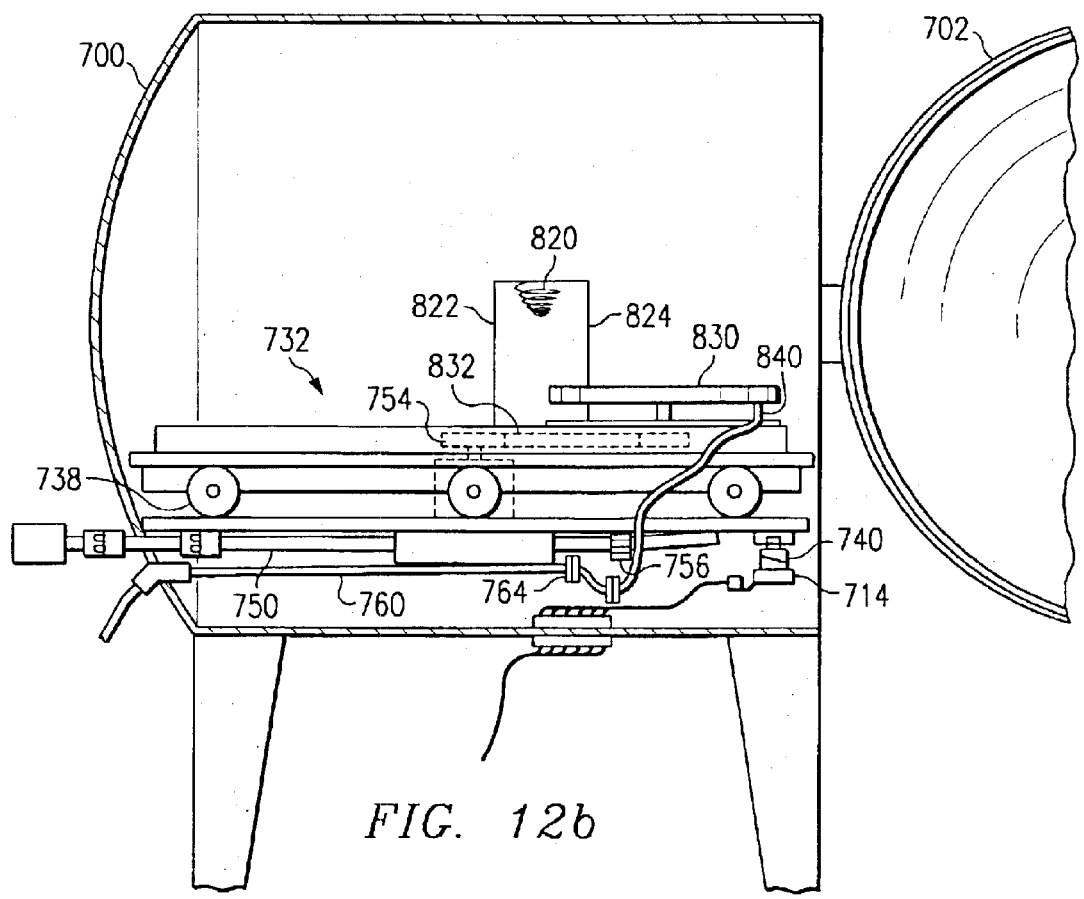

FIGS. 12*a–b* is a top and side view of the vacuum table assembly 732 illustrating a filament 820, which is mechanically supported by a first filament conductor 822 and a second filament conductor 824. The first filament conductor 822 and the second filament conductor 824 also provide an electrical path, as just discussed above, back to the desired pad of the filament power connector 740.

A platform 830 is shown mounted using the support members 804 and 802 and a belt being driven by the gearbox 754 of the mechanical drive 750 through an opening in the insulated surface 800 using a belt 832 coupled to the base underneath the table or platform 830. A substrate may be provided on the top surface of the platform 830 for coating. A commutator, not shown in FIG. 12a, is provided through the insulated surface 800 at the second end 764 of the electrical feed through 760 such that the commutator touches the bottom portion of the platform 830, which provides an electrical path to the top surface of the platform 830 and thus to the substrate to be coated.

FIG. 12b generally shows a side view of FIG. 12a with the vacuum table assembly 732 implemented within the internal volume of the vacuum chamber 700. A commutator 840 is shown coupled to the electrical feed through 760 and electrically coupled to the bottom surface of the platform 830. As is also illustrated, the various mechanical and electrical connections are shown to correlate as the vacuum table assembly 732 is provided within the internal volume of the vacuum chamber 700.

Figure 13:
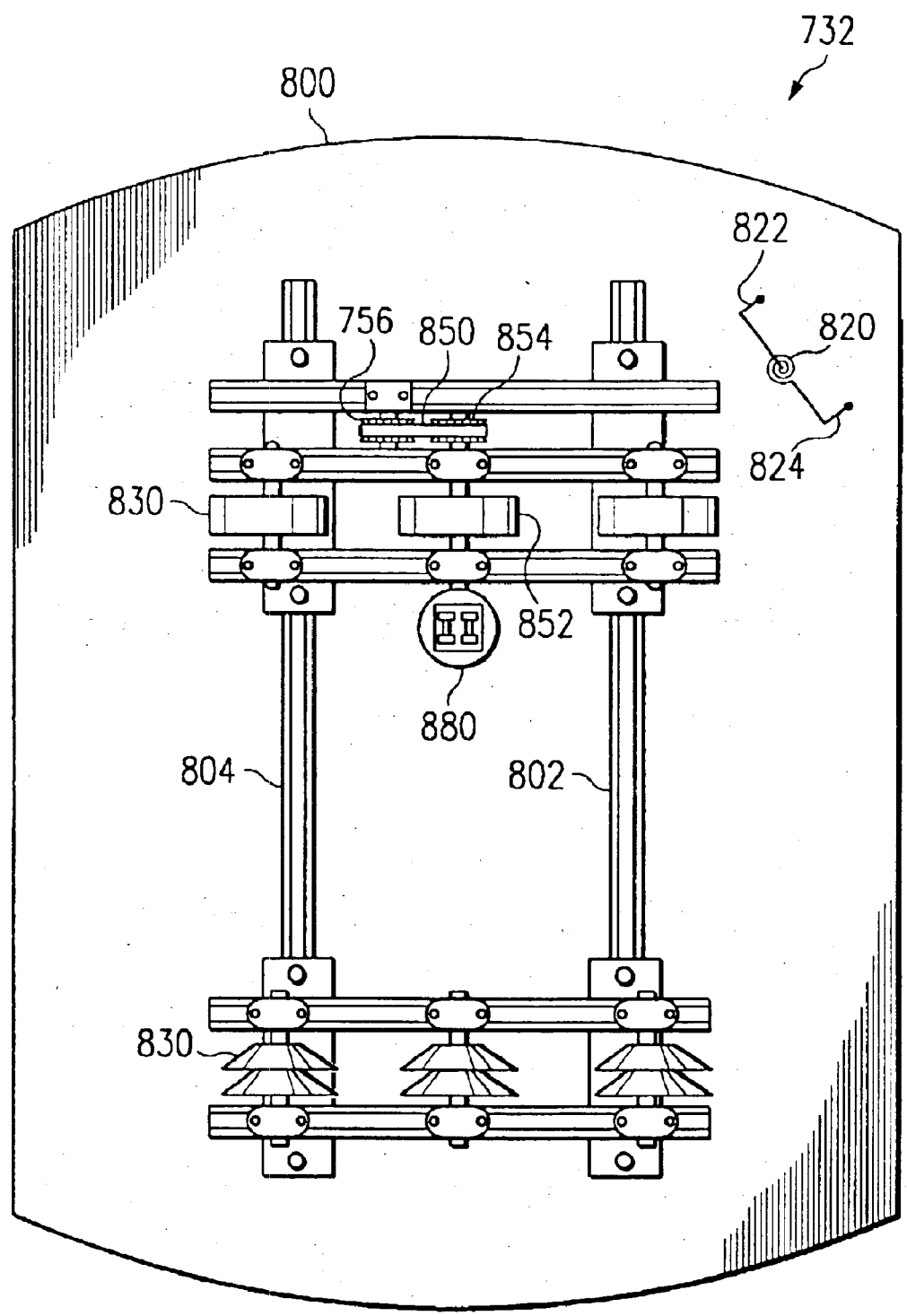
FIG. 13 is a top and side view of the vacuum table assembly with a platform implemented with a double roller assembly.

FIG. 13 is a top view of the vacuum table assembly 732 with a platform 830 implemented as a double roller assembly. This arrangement allows two, long cylindrical shaped substrates to be rotated and plated simultaneously. The gear 756 drives a central roller 852 through a belt 850 coupled to a gear 854. This rotation allows, for example, two reactor vessel head studs to be place side by side and rotated. A commutator 880, such as spring-loaded roller, commutator will contact each of the substrates, such as the reactor vessel head studs so that an electrical signal can be provided to the substrate as desired. This also illustrates the versatility of the support members 804 and 802 by illustrating that various different types of platforms that may be used.

Figure 14A:
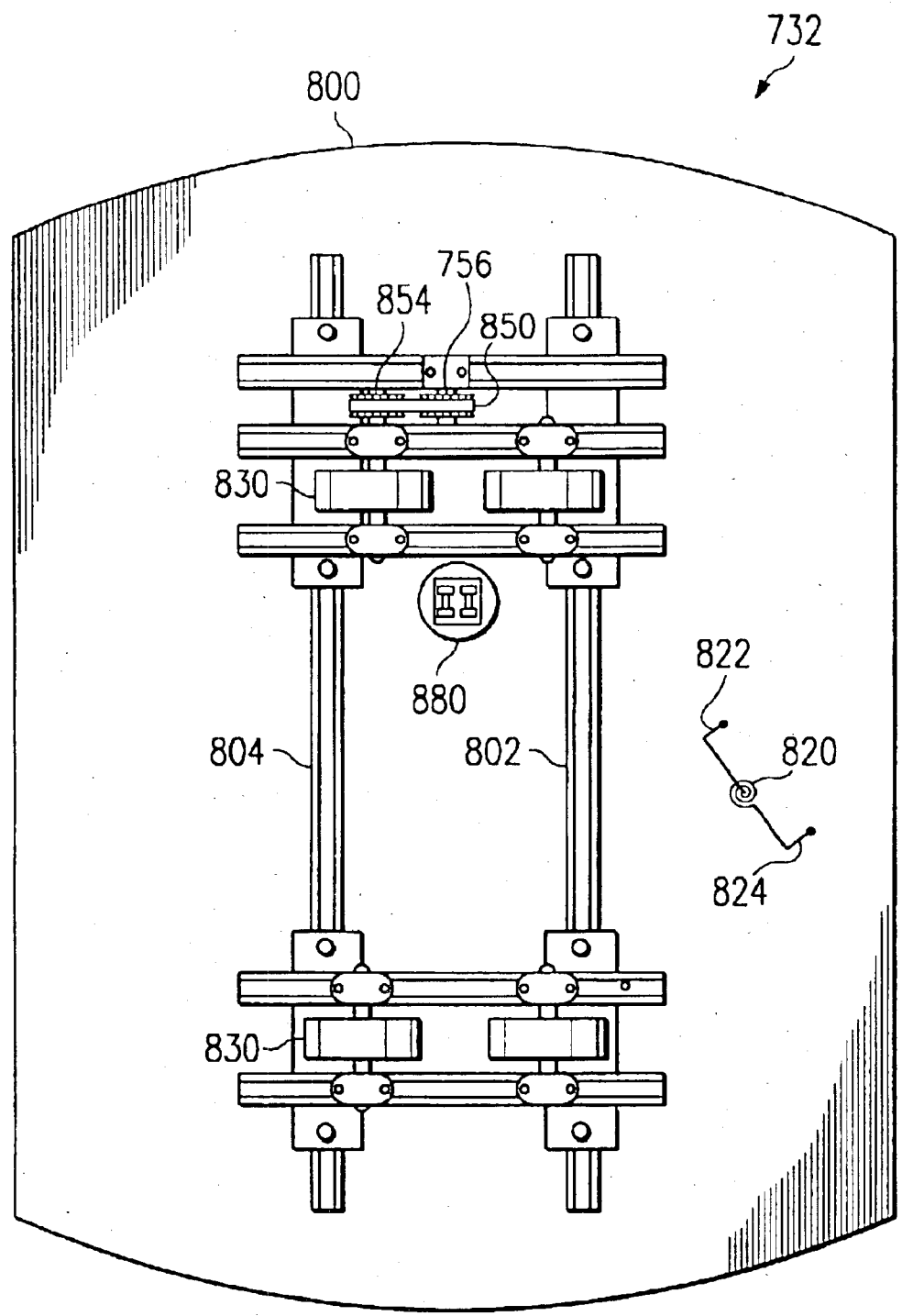
FIGS. 14a–b is a top and side view of the vacuum table assembly with a platform implemented as a single roller assembly.
Figure 14B:
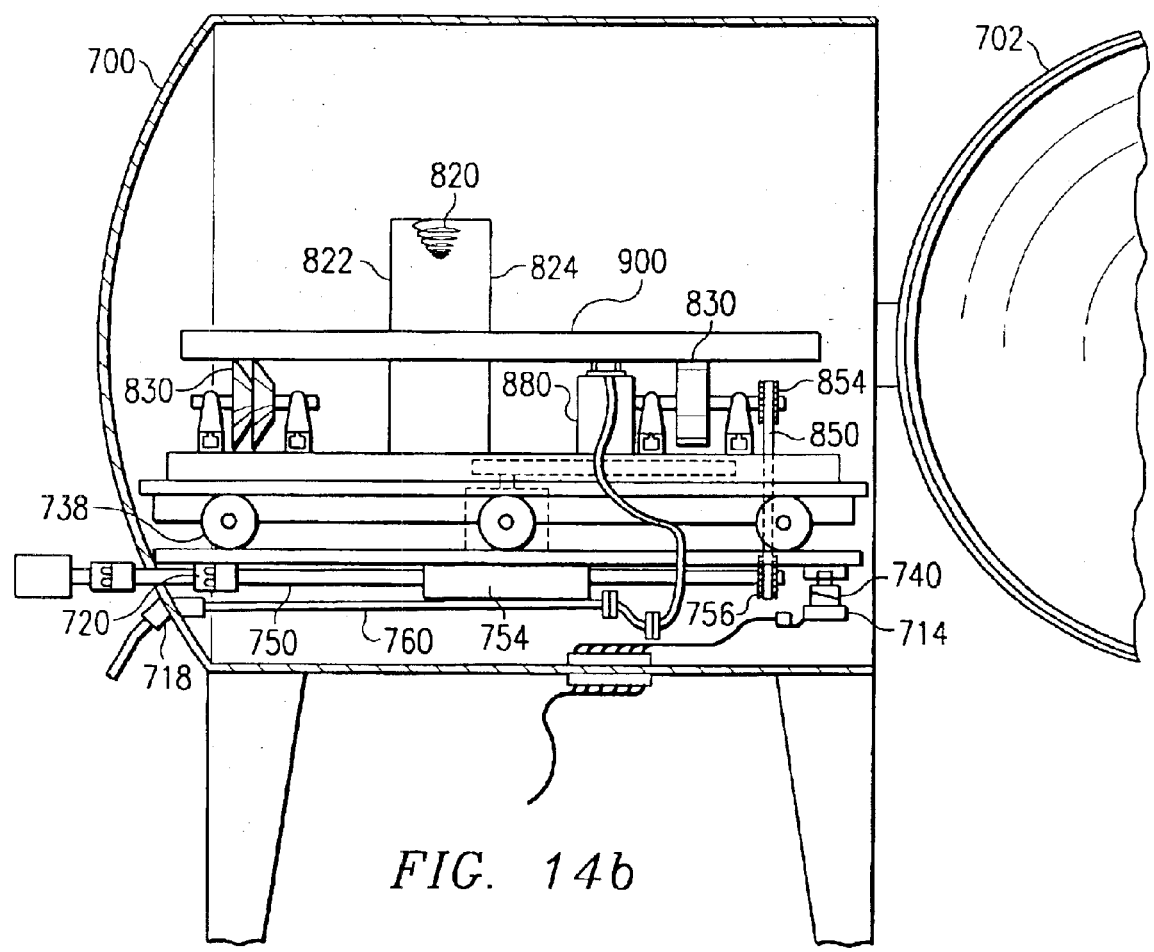

FIGS. 14a–b is a top and side view of the vacuum table assembly 732 with a platform 830 implemented as a single roller assembly. It is referred to as a single roller assembly because only one cylindrical substrate may be provided at a given time, unlike in FIG. 13. FIG. 14a is similar to FIG. 13 except that only two rollers are provided at each end of the substrate as it is being rotated.

FIG. 14b is a side view similar to FIG. 12b except that the platform 830 is implemented with the rollers on either end of a substrate 900. The substrate 900 may be implemented as a reactor vessel head stud to be rotated and coated. A depositant may be provided within the filament 820 and evaporated during the plating process.

Figure 15A:
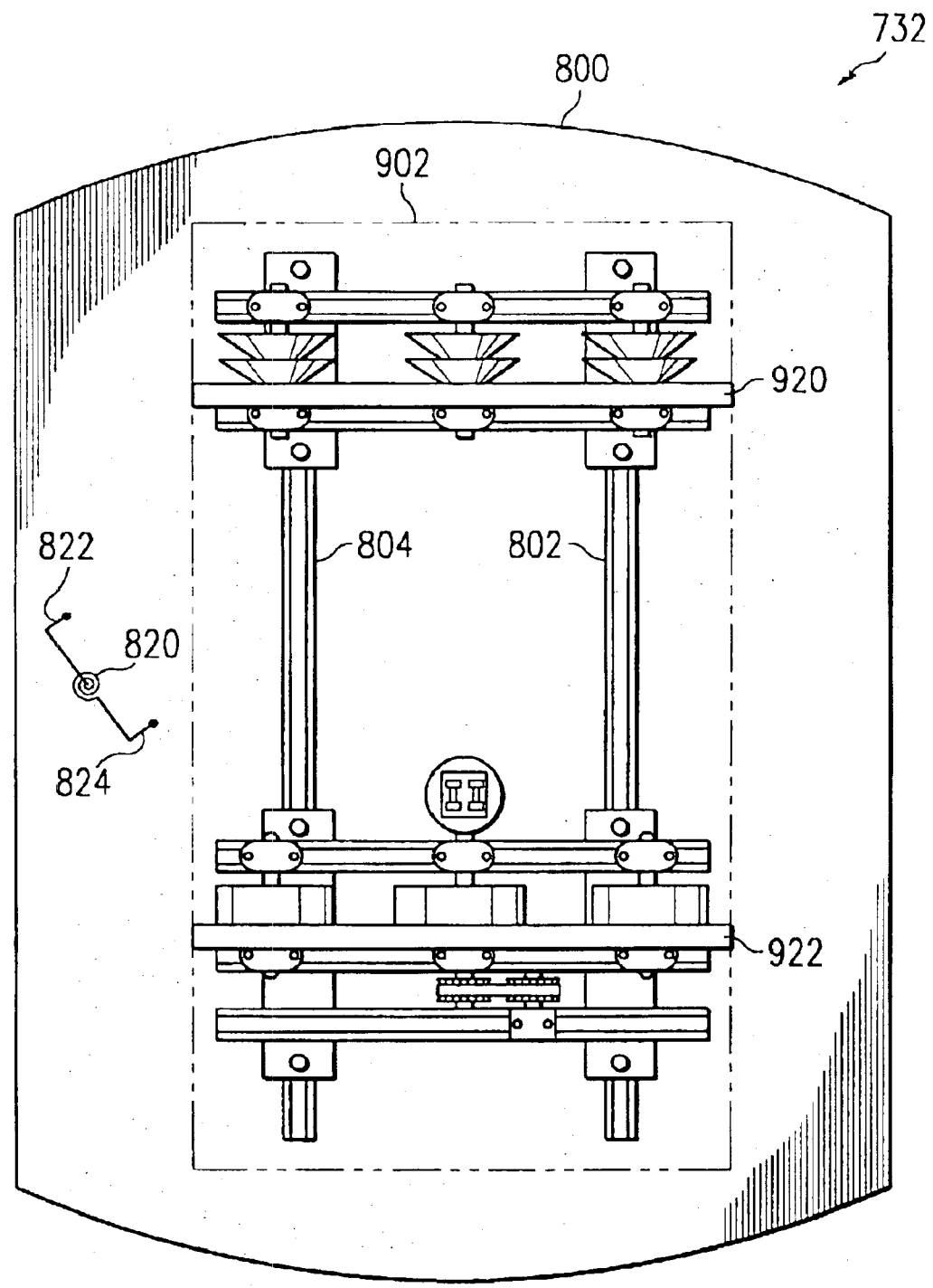
FIGS. 15a–b is a top and side view of the vacuum table assembly with a platform implemented as a conductive plate.
Figure 15B:
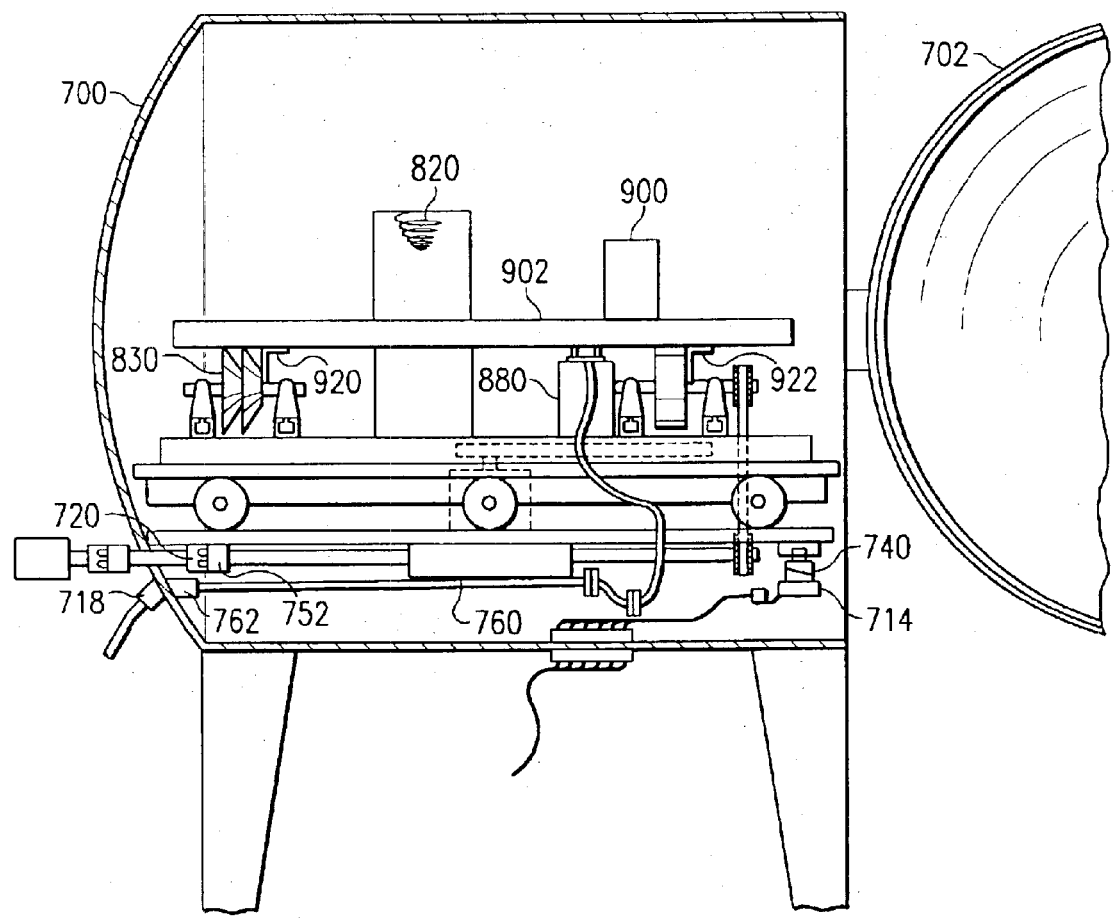

FIGS. 15a–b is a top and side view of the vacuum table assembly 732 with a platform implemented as a conductive plate 902. Referring now to FIG. 15a, the conductive plate 902 is provided on top of the double roller assembly as shown and previously described in connection with FIG. 13. In a preferred embodiment, an angle iron member 920 and an angle iron member 922 are positioned across the rollers as shown. This provides additional mechanical stability and support for the plate 902.

FIG. 15b shows a side view of what is illustrated in FIG. 15a except that a substrate 900 is shown on the surface of the conductive plate 902. The conductive plate 902 is electrically coupled to the electrical feed through 760 by a commutator or direct connection 880.

FIG. 16 is a side view of the configurable vacuum system 1000 with the vacuum table assembly 732 shown resting on and transported by a cart 960 to the vacuum chamber 700 so that the various connections of the vacuum table assembly 732 may be automatically connected as the vacuum table assembly 732 is slid or rolled into the vacuum chamber 700. A control cabinet 962 is shown for controlling a plating or depositant process and to control the mechanical and electrical inputs into the vacuum chamber 700.

Thus, it is apparent that there has been provided, in accordance with the present invention, a configurable vacuum system and method that satisfies one or more of the advantages set forth above. Although the preferred embodiment has been described in detail, it should be understood that various changes, substitutions, and alterations can be made herein without departing from the scope of the present invention, even if all, one, or some of the advantages identified above are not present. For example, one or more of the mechanical drive, the electrical feed through, and the filament power connector may not be needed in a particular deposition technology application. As another example, the mechanical drive and the filament power connector may, for example, couple directly to the support from of the vacuum table assembly, through one another, or through some intermediate coupling or mounting. The present invention may be implemented using any of a variety of materials and configurations. For example, any of a variety of vacuum pump systems, equipment, and technology could be used in the present invention. These are only a few of the examples of other arrangements or configurations of the configurable vacuum system and method that is contemplated and covered by the present invention.

The various components, equipment, substances, elements, and processes described and illustrated in the preferred embodiment as discrete or separate may be combined or integrated with other elements and processes without departing from the scope of the present invention. For example, the mechanical drive and the electrical feed through could conceivably be implemented through one structure. Other examples of changes, substitutions, and alterations are readily ascertainable by one skilled in the art and could be made without departing from the spirit and scope of the present invention.

What is claimed is:

1. A configurable vacuum system comprising:
    a vacuum table assembly for use in a vacuum chamber for plating a substrate, the vacuum table assembly including:
        a support frame operable to provide structural support to the vacuum table assembly,
        a sliding means positioned to support the vacuum table assembly when the vacuum table assembly is positioned in the vacuum chamber, the sliding means operable to facilitate the movement of the vacuum table assembly,
        an insulated surface with a top, a bottom, and supported by the support frame, and
        a platform operable to rotate and support the substrate, the platform positioned above the top of the insulated surface;
    a mechanical drive operable to rotate the platform;
    an electrical feed through operable to communicate an electrical signal to the substrate on the platform;
    a filament positioned relative the substrate, the filament operable to be positioned in more than one location so that substrates of different shapes may be plated; and
    a vacuum chamber having a main opening, an internal volume, a receiving means operable to receive and support the vacuum table assembly within the internal volume of the vacuum chamber, and wherein the sliding means of the vacuum table assembly is operable to engage the receiving means of the vacuum chamber.

2. The configurable vacuum system of claim 1, further comprising:

a cart operable to support the vacuum table assembly when outside of the vacuum chamber, and to assist with positioning the vacuum table assembly into the vacuum chamber and out of the vacuum chamber.

3. The configurable vacuum system of claim 1, wherein the sliding means of the vacuum table assembly is a roller.

4. The configurable vacuum system of claim 1, wherein the sliding means of the vacuum table assembly is a bearing.

5. The configurable vacuum system of claim 1, wherein the sliding means of the vacuum table assembly is a low friction surface.

6. The configurable vacuum system of claim 1, wherein the receiving means of the vacuum chamber is a rail positioned in the internal volume of the vacuum chamber, and the sliding means of the vacuum table assembly engages the rail.

7. The configurable vacuum system of claim 1, wherein the platform is a turntable.

8. The configurable vacuum system of claim 1, wherein the platform is a roller assembly.

9. The configurable vacuum system of claim 1, wherein the platform of the vacuum table assembly is positioned above the top of the insulated surface through a detachable coupling.

10. The configurable vacuum system of claim 9, wherein the platform is one from the group that includes a turntable and a roller assembly.

11. The configurable vacuum system of claim 1, wherein the electrical feed through communicates an electrical signal to the substrate that includes a negative dc potential.

12. The configurable vacuum system of claim 1, wherein the electrical feed through communicates an electrical signal to the substrate that includes an rf signal.

13. The configurable vacuum system of claim 1, wherein the electrical feed through communicates an electrical signal to the substrate that includes a negative dc potential and an rf signal.

14. The configurable vacuum system of claim 1, further comprising:
   a motor operable to rotate the mechanical drive.

15. The configurable vacuum system of claim 14, wherein the motor is positioned in the vacuum chamber.

16. The configurable vacuum system of claim 14, wherein the motor is positioned external the internal volume of the vacuum chamber.

17. The configurable vacuum system of claim 14, wherein the motor includes one from the group that includes an electric motor, a hydraulic motor or a manual motor.

18. The configurable vacuum system of claim 1, wherein the mechanical drive is positioned in the vacuum chamber.

19. The configurable vacuum system of claim 1, wherein the mechanical drive is supported by the vacuum table assembly.

20. The configurable vacuum system of claim 1, wherein the filament is supported by the vacuum table assembly.

21. The configurable vacuum system of claim 1, wherein the filament is positioned in the vacuum chamber.

22. The configurable vacuum system of claim 1, further comprising:
   a filament power source operable to electrically couple to the filament to provide power to the filament.

23. The configurable vacuum system of claim 1, wherein the insulated surface of the vacuum table assembly includes an opening, and the mechanical drive extends through the opening and couples to the platform to provide rotation to the platform.

24. The configurable vacuum system of claim 1, wherein the platform is a turntable made of an electrically conductive material, and the electrical feed through is operable to communicate the electrical signal to the substrate by contacting the turntable, upon which the substrate resides.

25. The configurable vacuum system of claim 24, wherein the electrical feed through extends through an opening in the insulated surface of the vacuum table assembly.

26. The configurable vacuum system of claim 1, wherein the platform is a roller assembly and the substrate resides on a roller of the roller assembly, and wherein the electrical feed through is operable to communicate the electrical signal to the substrate by contacting the substrate through a commutator.

27. The configurable vacuum system of claim 26, wherein the electrical feed through extends through an opening in the insulated surface of the vacuum table assembly.

28. A configurable vacuum table assembly for use in a vacuum chamber for plating a substrate, the configurable vacuum table assembly comprising:
   a support frame operable to provide structural support to the configurable vacuum table assembly;
   a rolling means positioned to support the configurable vacuum table assembly when the configurable vacuum table assembly is positioned in the vacuum chamber, the rolling means operable to facilitate the movement of the configurable vacuum table assembly;
   an insulated surface with a top, a bottom, and supported by the support frame;
   a platform that is one from the group that includes a turntable and a roller assembly, the platform operable to rotate and support the substrate, the platform positioned above the top of the insulated surface through a detachable coupling; and
   a filament positioned relative the substrate, the filament operable to be positioned in more than one location so that substrates of different shapes may be plated.

29. The configurable vacuum table assembly of claim 28, wherein the insulated surface includes an opening, and further comprising:
   a mechanical drive that extends through the opening in the insulated surface and couples to the platform to provide rotation to the platform when rotational motion is provided to the mechanical drive.

30. The configurable vacuum table assembly of claim 28, further comprising:
   an electrical feed through operable to communicate an electrical signal to the substrate on the platform when an electrical signal is provided through the electrical feed through.

* * * * *

UNITED STATES PATENT AND TRADEMARK OFFICE
CERTIFICATE OF CORRECTION

PATENT NO. : 6,905,582 B2
DATED : June 14, 2005
INVENTOR(S) : Kidd et al.

It is certified that error appears in the above-identified patent and that said Letters Patent is hereby corrected as shown below:

Title page,
Item [56], References Cited, OTHER PUBLICATIONS,
delete "09/472,775" and insert -- 09/427,775 --.
"Kidd" reference, please delete "not assigned" and insert -- 10/337,642 --.
Please insert -- Kidd et al., Mobile Plating System and Method, U.S. Appln. No. 10/337,534, 1/6/2003. --.
"Bunshah" reference, please delete "Bunshah, R.F." and insert -- Mattox, D.M. --.
Please insert -- Bunshah, R.F., Handbook of Deposition Technologies for Films and Coatings, 1994, 2nd Ed., Noyes Publications, Westwood, NJ. --.

Signed and Sealed this

Twenty-seventh Day of September, 2005

JON W. DUDAS
*Director of the United States Patent and Trademark Office*